(12) United States Patent
Chang et al.

(10) Patent No.: US 11,456,268 B2
(45) Date of Patent: Sep. 27, 2022

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Jung-Hua Chang, Hsinchu (TW); Chin-Fu Kao, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 50 days.

(21) Appl. No.: 16/252,734

(22) Filed: Jan. 21, 2019

(65) Prior Publication Data

US 2020/0235065 A1    Jul. 23, 2020

(51) Int. Cl.
*H01L 23/00* (2006.01)
*H01L 25/00* (2006.01)

(52) U.S. Cl.
CPC .............. *H01L 24/14* (2013.01); *H01L 24/16* (2013.01); *H01L 24/17* (2013.01); *H01L 24/24* (2013.01); *H01L 24/25* (2013.01); *H01L 24/73* (2013.01); *H01L 25/50* (2013.01); *H01L 2224/11019* (2013.01); *H01L 2224/11462* (2013.01); *H01L 2224/12105* (2013.01); *H01L 2224/13014* (2013.01); *H01L 2224/1403* (2013.01); *H01L 2224/14135* (2013.01); *H01L 2224/14136* (2013.01); *H01L 2224/14177* (2013.01); *H01L 2224/14517* (2013.01); *H01L 2224/16145* (2013.01); *H01L 2224/1703* (2013.01); *H01L 2224/17135* (2013.01); *H01L 2224/17136* (2013.01); *H01L 2224/17177* (2013.01);

(Continued)

(58) Field of Classification Search
CPC ..................... H01L 2224/14515–14519; H01L 2224/17515–17519; H01L 25/0652; H01L 25/0655; H01L 24/17; H01L 24/14; H01L 23/5389; H01L 23/5384; H01L 23/49827; H01L 2224/18–255; H01L 24/18–25
See application file for complete search history.

(56) References Cited

U.S. PATENT DOCUMENTS 9,000,584 B2    4/2015   Lin et al.
9,048,222 B2    6/2015   Hung et al.
(Continued)

*Primary Examiner* — Lauren R Bell
(74) *Attorney, Agent, or Firm* — JCIPRNET

(57) ABSTRACT

A semiconductor package and a manufacturing method thereof are provided. The semiconductor package includes a first semiconductor die, an insulating encapsulation laterally encapsulating the first semiconductor die, and a redistribution structure disposed on the first semiconductor die and the insulating encapsulation. The first semiconductor die includes a first contact region and a first non-contact region in proximity to the first contact region. The first semiconductor die includes a first electrical connector disposed on the first contact region and a first dummy conductor disposed on the first non-contact region, and the first electrical connector is electrically connected to a first integrated circuit (IC) component in the first semiconductor die. The first electrical connector is electrically connected to the redistribution structure, and the first dummy conductor is electrically insulated from the first IC component in the first semiconductor die and the redistribution structure.

23 Claims, 20 Drawing Sheets

(52) U.S. Cl.
CPC ............. *H01L 2224/24137* (2013.01); *H01L 2224/24146* (2013.01); *H01L 2224/2518* (2013.01); *H01L 2224/25105* (2013.01); *H01L 2224/25171* (2013.01); *H01L 2224/25174* (2013.01); *H01L 2224/73209* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2002/0056899 A1* | 5/2002 | Hikita | H01L 24/13 257/686 |
| 2013/0043583 A1* | 2/2013 | Wu | H01L 24/11 257/737 |
| 2013/0087925 A1* | 4/2013 | Tsai | H01L 24/14 257/774 |
| 2014/0191419 A1* | 7/2014 | Mallik | H01L 25/0657 257/777 |
| 2015/0228587 A1* | 8/2015 | Cheng | H01L 23/544 257/777 |
| 2019/0043792 A1* | 2/2019 | Weerasekera | H01L 21/4857 |

* cited by examiner

SEMICONDUCTOR PACKAGE AND MANUFACTURING METHOD THEREOF

BACKGROUND

The semiconductor industry has experienced rapid growth due to continuous improvements in the integration density of a variety of electronic components (e.g., transistors, diodes, resistors, capacitors, etc.). For the most part, these improvements in integration density have come from repeated reductions in minimum feature size, which allows more components to be integrated into a given area. Technological advances in integrated circuit (IC) design have produced generations of ICs where each generation has smaller and more complex circuit designs than the previous generation. However, these advances have increased the complexity of processing and manufacturing. In an aspect of conventional plating and etching processes suffer from uniformity issues due to the loading effect. Uniform conductive bumps are difficult to achieve, and thus, such defect would result in the failure of semiconductor package. Accordingly, there has grown a need for smaller, more reliable and more creative semiconductor packaging techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
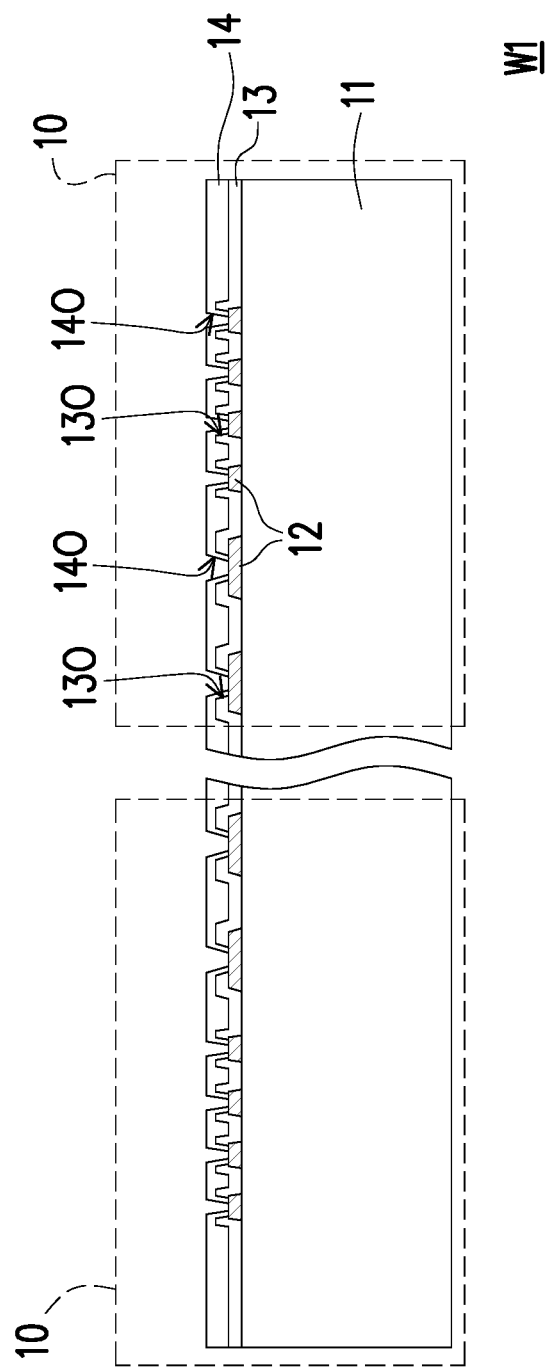
FIG. 1A to FIG. 1C are schematic cross-sectional views of various stages of manufacturing a semiconductor die in accordance with some exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
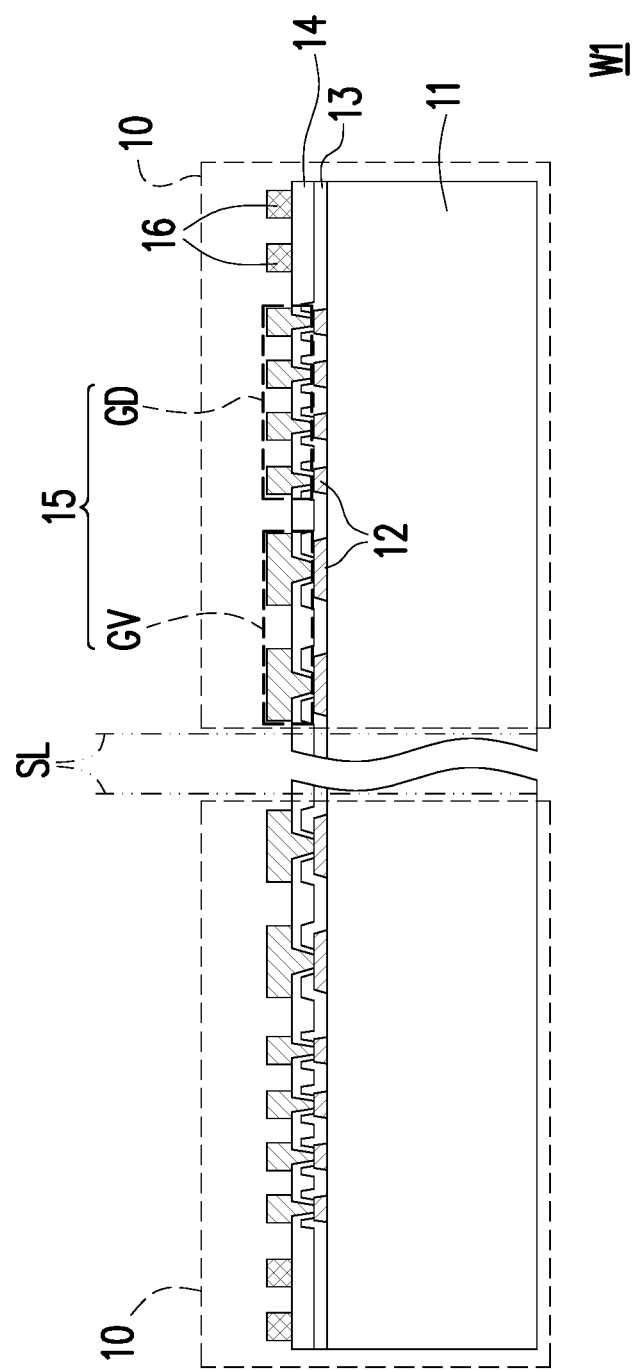
Figure 1C:
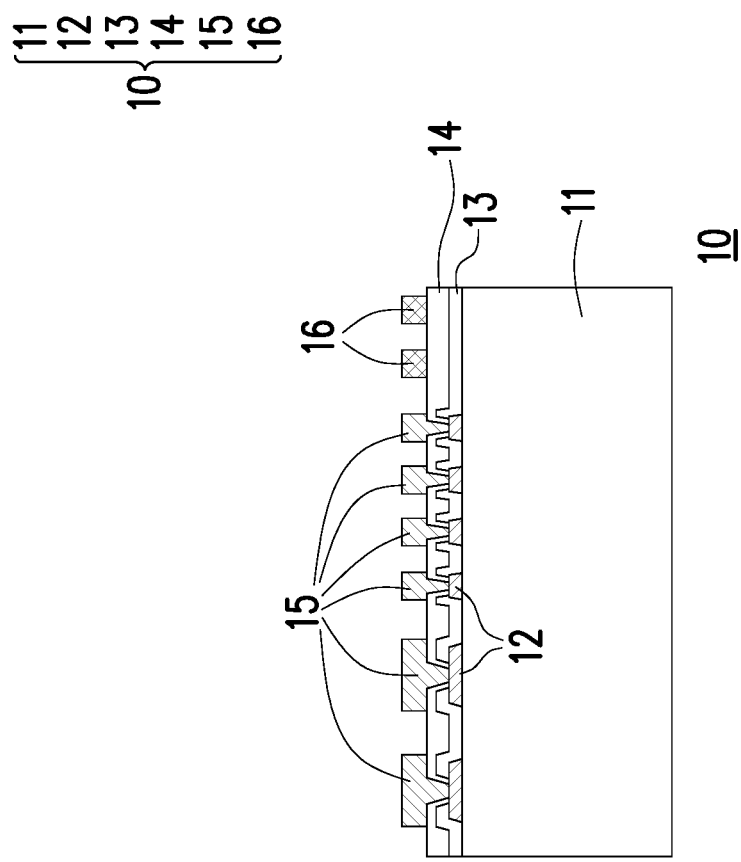

FIG. 1A to FIG. 1C are schematic cross-sectional views of various stages of manufacturing a semiconductor die in accordance with some exemplary embodiments of the disclosure. Referring to FIG. 1A, a semiconductor wafer W1 including a plurality of semiconductor dies 10 which are arranged in an array is provided. Before performing a wafer dicing process on the semiconductor wafer W1, the semiconductor dies 10 of the semiconductor wafer W1 are physically connected to one another. In some embodiments, the semiconductor wafer W1 is manufactured through a front end of line (FEOL) process. However, the disclosure is not limited thereto. It should be appreciated that the illustration of the semiconductor wafer and other components throughout figures is schematic and is not in scale. In some embodiments, the semiconductor wafer W1 includes a semiconductor substrate 11, a plurality of conductive pads 12 formed on the semiconductor substrate 11, and a passivation layer 13. The passivation layer 13 is formed over the semiconductor substrate 11 and has a plurality of contact openings 13O. The conductive pads 12 may be partially exposed by the contact openings 13O of the passivation layer 13.

In some embodiments, the semiconductor wafer W1 is a device wafer. For example, the semiconductor substrate 11 may be a substrate including integrated circuit (IC) components (not shown) formed therein. In some embodiments, semiconductor substrate 11 includes semiconductor materials such as silicon, strained silicon, silicon alloy, silicon carbide, silicon-germanium, silicon-germanium carbide, germanium, a germanium alloy, germanium-arsenic, indium-arsenic, group III-V semiconductors, or the like. The IC components may include IC interconnections, active components (e.g., transistors or the like) and/or passive components (e.g., resistors, capacitors, inductors or the like). The conductive pads 12 may be aluminum pads, copper pads or other suitable metal pads. The passivation layer 13 may be a silicon oxide layer, a silicon nitride layer, a silicon oxy-nitride layer, or a dielectric layer formed by other suitable dielectric materials. The semiconductor wafer W1 optionally includes a post-passivation layer 14 formed over the passivation layer 13. The post-passivation layer 14 covers the passivation layer 13 and has a plurality of contact openings 14O corresponding to the contact openings 13O. The conductive pads 12 partially exposed by the contact openings 13O of the passivation layer 13 are partially exposed by the contact openings 14O of the post-passivation layer 14. The post-passivation layer 14 may be a polyimide (PI) layer, a polybenzoxazole (PBO) layer, or a dielectric layer made of other suitable dielectric material(s).

Referring to FIG. 1B and FIG. 1C, a plurality of electrical connectors 15 is formed on the conductive pads 12, and a plurality of dummy conductors 16 is formed on the post-passivation layer 14. In some embodiments, the electrical connectors 15 are pillars/posts/vias/bumps made of conductive materials (e.g., copper, gold, nickel, metal alloy, or the like). In alternative embodiments, the electrical connectors 15 are metallic pillars which are covered by conductive caps (e.g., solder caps). The electrical connectors 15 may be formed in an array having different pitches and critical dimensions for subsequently formed/bonded elements as will be described later in other embodiments. The critical dimension of one of electrical connectors 15 may range from 10 μm to 100 μm approximately. In some embodiments, the critical dimension of one of electrical connectors 15 may be in a range between about 15 μm to about 70 μm. The electrical connectors 15 may include a via-connecting group GV, and a die-connecting group GD disposed between the via-connecting group GV and the dummy conductors 16. The electrical connectors 15 classified in the die-connecting group GD may have critical dimensions that are smaller or finer than the critical dimensions of the electrical connectors 15 classified in the via-connecting group GV. In some embodiments, a distribution density of the electrical connectors 15 classified in the array of the die-connecting group GD is denser than that of the electrical connectors 15 classified in the array of the via-connecting group GV.

The dummy conductors 16 may have similar pitches and critical dimensions to one of the groups (e.g., via-connecting group GV or die-connecting group GD) configured aside the dummy conductors 16. For example, the dummy conductors 16 include conductive pillars/posts/vias/bumps having similar dimensions to the electrical connectors 15 formed most adjacent thereto. It should be appreciated that the pitches and critical dimensions of the dummy conductors 16 are feasible depending on the design requirements. In other embodiments, the semiconductor substrate 11 includes a central region and a peripheral region around the central region in a top view (not shown). The array of the electrical connectors 15 may be distributed corresponding to the central region of the semiconductor substrate 11, and the dummy conductors 16 may be arranged corresponding to the peripheral region within the perimeter of the semiconductor substrate 11. In some embodiments, the dummy conductors 16 may be configured to encircle at least one outermost edge of the array of electrical connectors 15 for alleviating a loading effect during formation. It should be noted that the dummy conductors 16 may be laid out in several manners, and may have several shapes. In some embodiments, the dummy conductors 16 include different shapes than the electrical connectors 15. The dummy conductors 16 may be formed from polygon, square, rectangle, round, or other shapes. In some embodiments, the dummy conductors 16 (e.g., in the form of strips, a hollow sheet, L-shaped plates, or the like) are laid out along more than one edges of the array of electrical connectors 15. In some embodiments, the dummy conductors 16 are laid out along four edges of the array of electrical connectors 15. In some embodiments, a single dummy conductor 16 in the form of a continuous ring may surround the array of electrical connectors 15. Other dummy conductor layouts are also possible. It should be appreciated that the electrical connectors 15 and the dummy conductors 16 depicted in FIG. 1A to FIG. 1C are merely one exemplary configuration.

In some embodiments, the electrical connectors 15 and the dummy conductors 16 are formed by a deposition process. In an exemplary embodiment, the forming process of the electrical connectors 15 and the dummy conductors 16 includes the following steps. First, a seed layer (not shown) is conformally deposited (e.g., by sputtering) onto the post-passivation layer 14 and the conductive pads 12 exposed by the contact openings 14O. A patterned photoresist layer having a plurality of first openings and second openings (not shown) is formed over the seed layer by, for example, spin coating of a photoresist material layer, baking of the photoresist material layer, and lithography (i.e., exposure and development processes). The first openings and the second openings may have different dimensions and pitches. Portions of the seed layer that are corresponding to the conductive pads 12 are exposed by the first openings of the patterned photoresist layer, and other portions of the seed layer that are corresponding to the post-passivation layer 14 are exposed by the second openings of the patterned photoresist layer. Next, conductive materials (e.g., copper, aluminum, gold, nickel, silver, palladium, tin, etc.) are formed inside the first openings and the second openings of the patterned photoresist layer by electro-plating, an electroless-plating, immersion plating, or other suitable deposition process. For example, the semiconductor wafer W1 including the patterned photoresist layer formed thereon may be immersed into a plating bath, such that conductive materials are formed inside the first openings and the second openings of the patterned photoresist layer to be in physical contact with the conductive pads 12. After the conductive materials are formed, the patterned photoresist layer is removed by, for example, etching or other suitable removal processes. Subsequently, by using the conductive materials as a mask, a part of the seed layer that is not covered by the conductive materials may be removed until the post-passivation layer 14 is exposed. It should be noted that the steps merely serve as an illustrative example, and the disclosure is not limited thereto.

In some embodiments, the portions of the conductive materials and the underlying seed layer in combination that are corresponding to the conductive pads 12 may be referred to as the electrical connectors 15, and the portions of the conductive materials and the underlying seed layer in combination that are corresponding to the post-passivation layer 14 may be referred to as the dummy conductors 16. In some embodiments, the electrical connectors 15 and/or the dummy conductors 16 have substantially vertical sidewalls with respective to the underlying post-passivation layer 14. For example, the electrical connectors 15 are in electrical and physical contact with the conductive pads 12 for electrically communicating other electrical components as will be described later in other embodiments. The dummy conductors 16 are located directly over, and may be in physical contact with, the post-passivation layer 14 such that the dummy conductors 16 are electrically insulated by the post-passivation layer 14. Since the dummy conductors 16 are formed on the post-passivation layer 14 and the electrical connectors 15 are formed on the conductive pads 12, the height of each dummy conductor 16 may be less than the height of each electrical connector 15. In some embodiments, the dummy conductors 16 are electrically isolated from the electrical connectors 15 and the IC components formed in the semiconductor substrate 11. The dummy conductors 16 may be electrically floating and may not have signal-transmitting function. In some embodiments, the forming processes of the electrical connectors 15 and the dummy conductors 16 are performed simultaneously such that the dummy conductors 16 formed herein may alleviate the adverse impacts associated with the loading effect (e.g., in the process of etching the seed layer), thereby improving the uniformity of critical dimensions of the electrical connectors 15.

In some embodiments, after forming the electrical connectors 15 and the dummy conductors 16, a protection layer (not shown) is formed on the post-passivation layer 14 to cover the electrical connectors 15 and the dummy conductors 16 for protection. For example, the protection layer is a polymer layer (e.g., a PBO layer, a PI layer, etc.) having sufficient thickness to encapsulate and protect the electrical connectors 15 and the dummy conductors 16.

Subsequently, a wafer dicing process may be performed on the semiconductor wafer W1 along singulating lines SL to separate individual semiconductor dies 10 from one another as shown in FIG. 1C. After performing a singulation process, each one of the semiconductor dies 10 may include the semiconductor substrate 11, the conductive pads 12 formed on the semiconductor substrate 11, the passivation layer 13 and the post-passivation layer 14 partially covering the conductive pads 12, the electrical connectors 15 connected to the conductive pads 12, and the dummy conductors 16 disposed aside the electrical connectors 15 and in contact with the post-passivation layer 14.

Figure 2A:
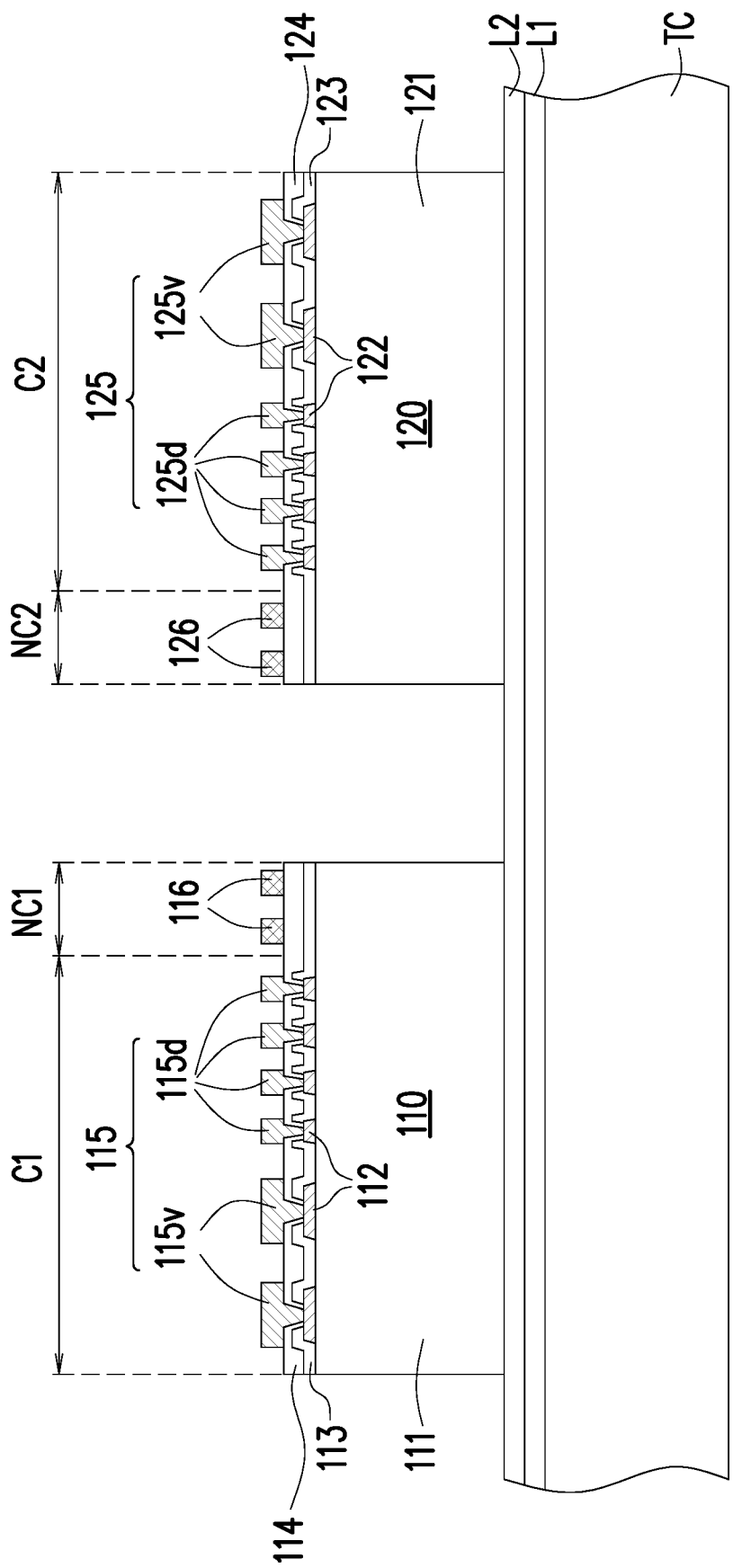
FIG. 2A to FIG. 2H are schematic cross-sectional views of various stages of manufacturing a semiconductor package in accordance with some exemplary embodiments of the disclosure.
Figure 2B:
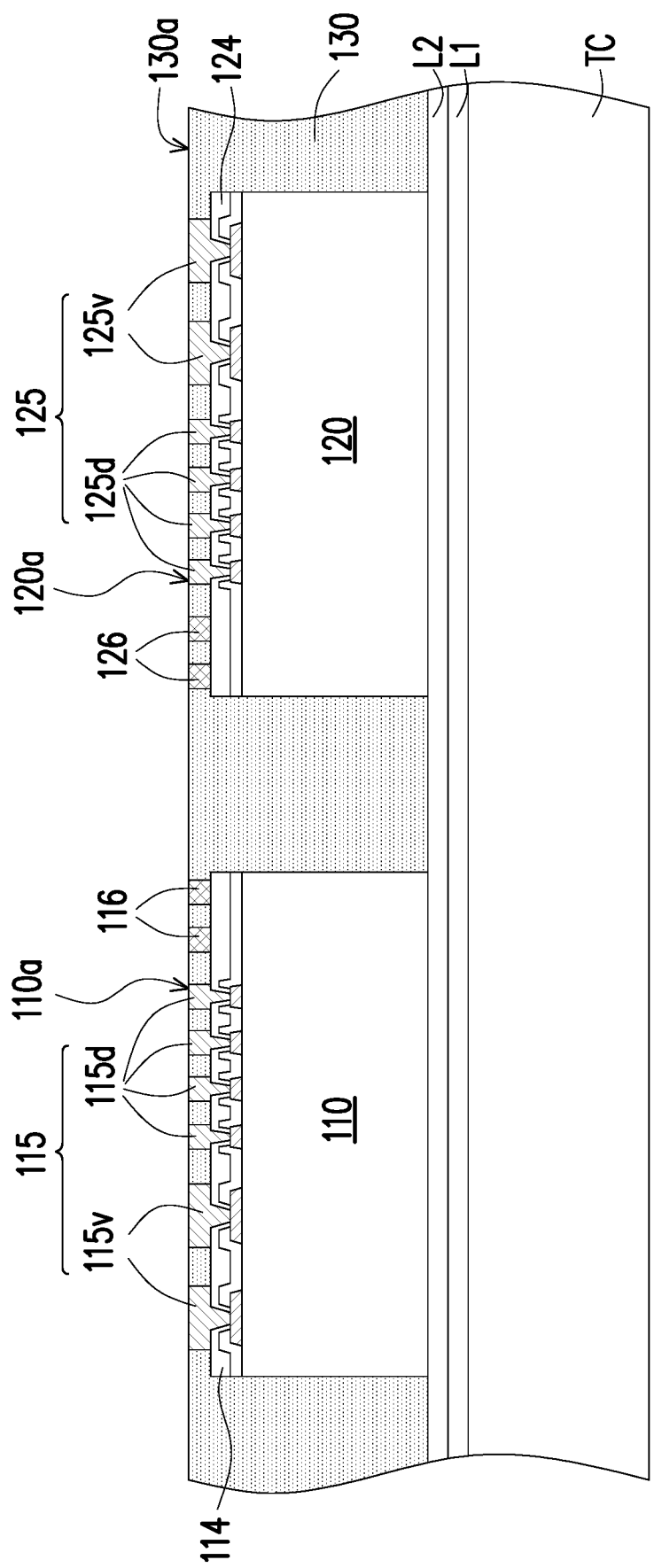
Figure 2C:
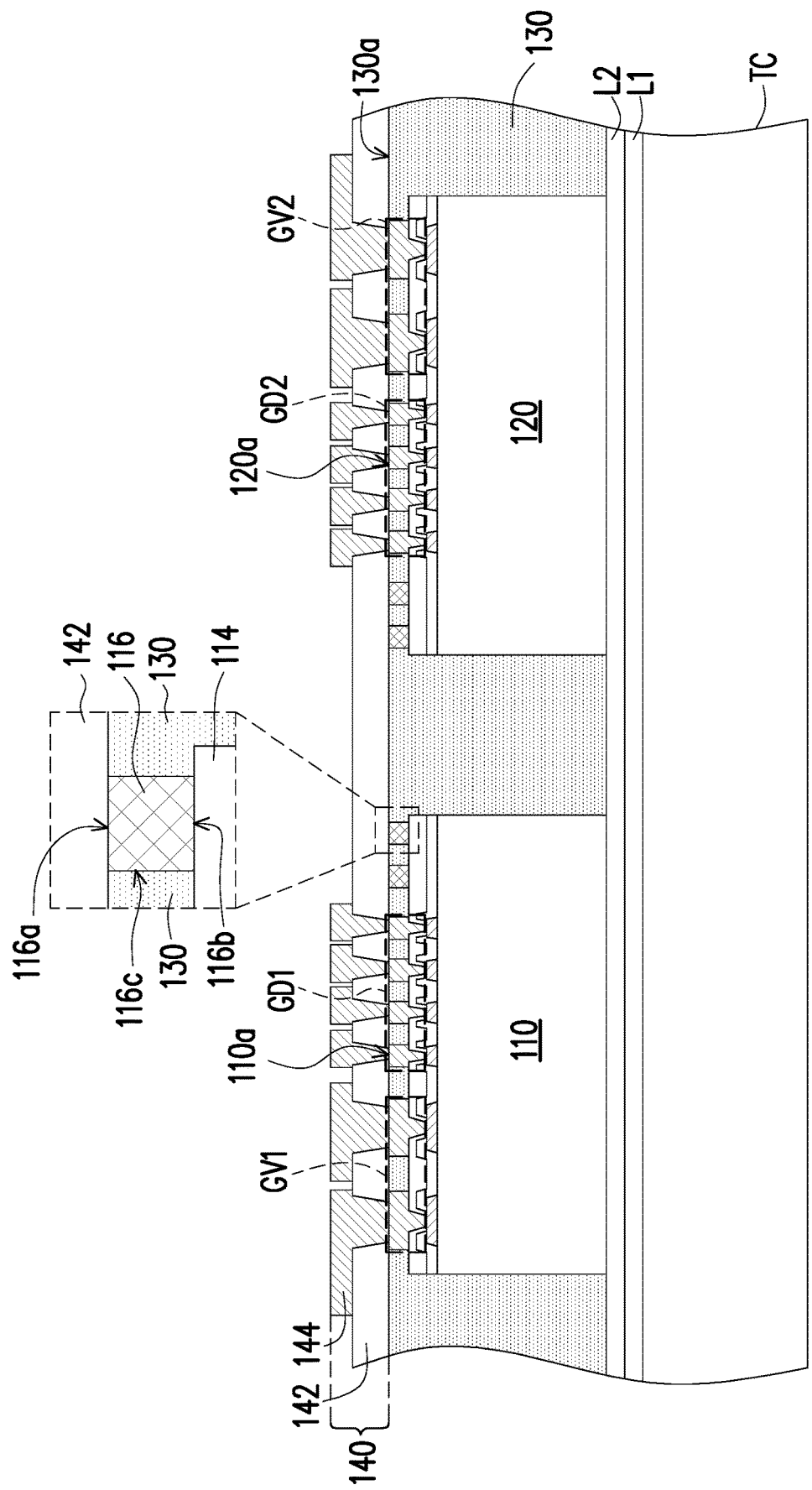
Figure 2D:
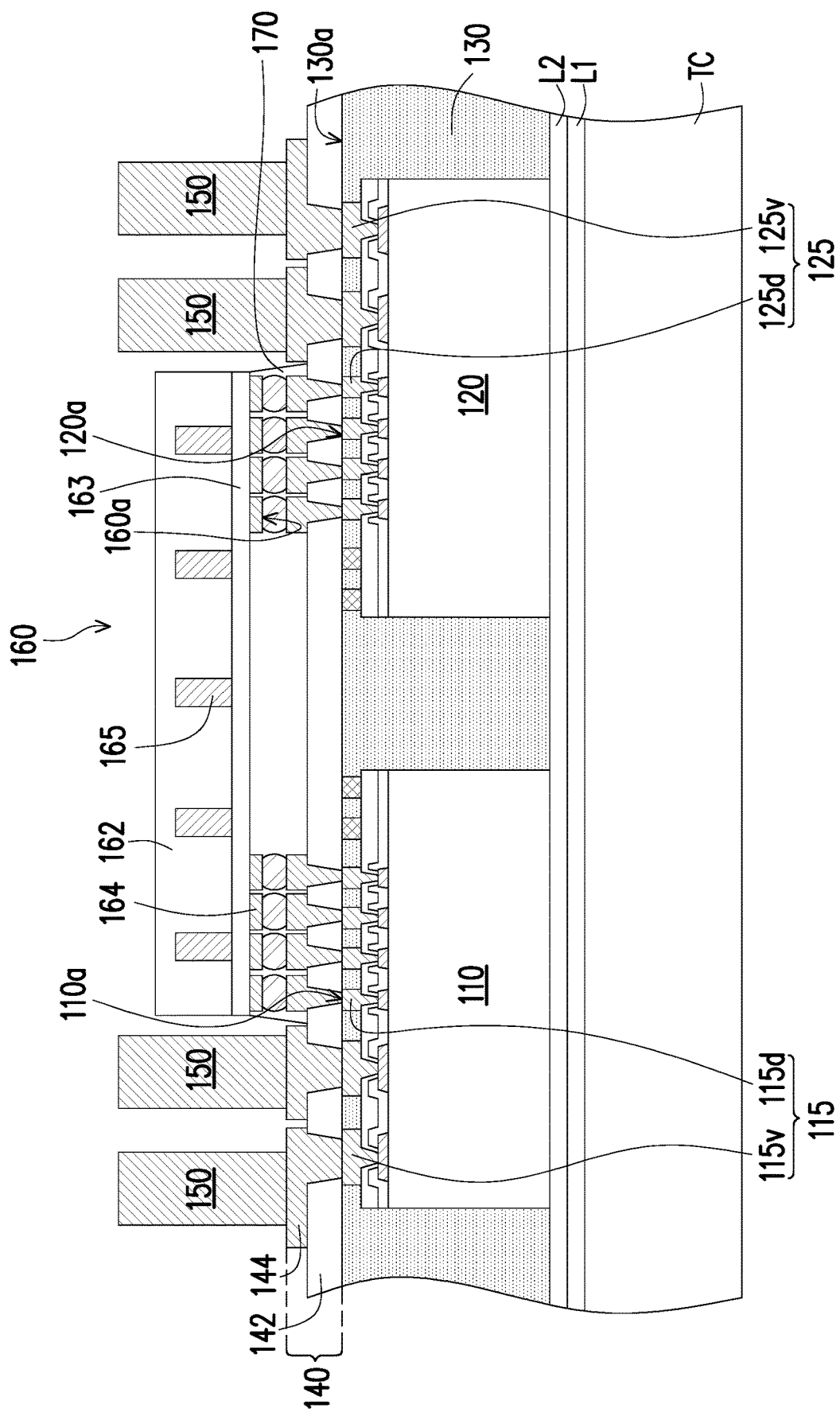
Figure 2E:
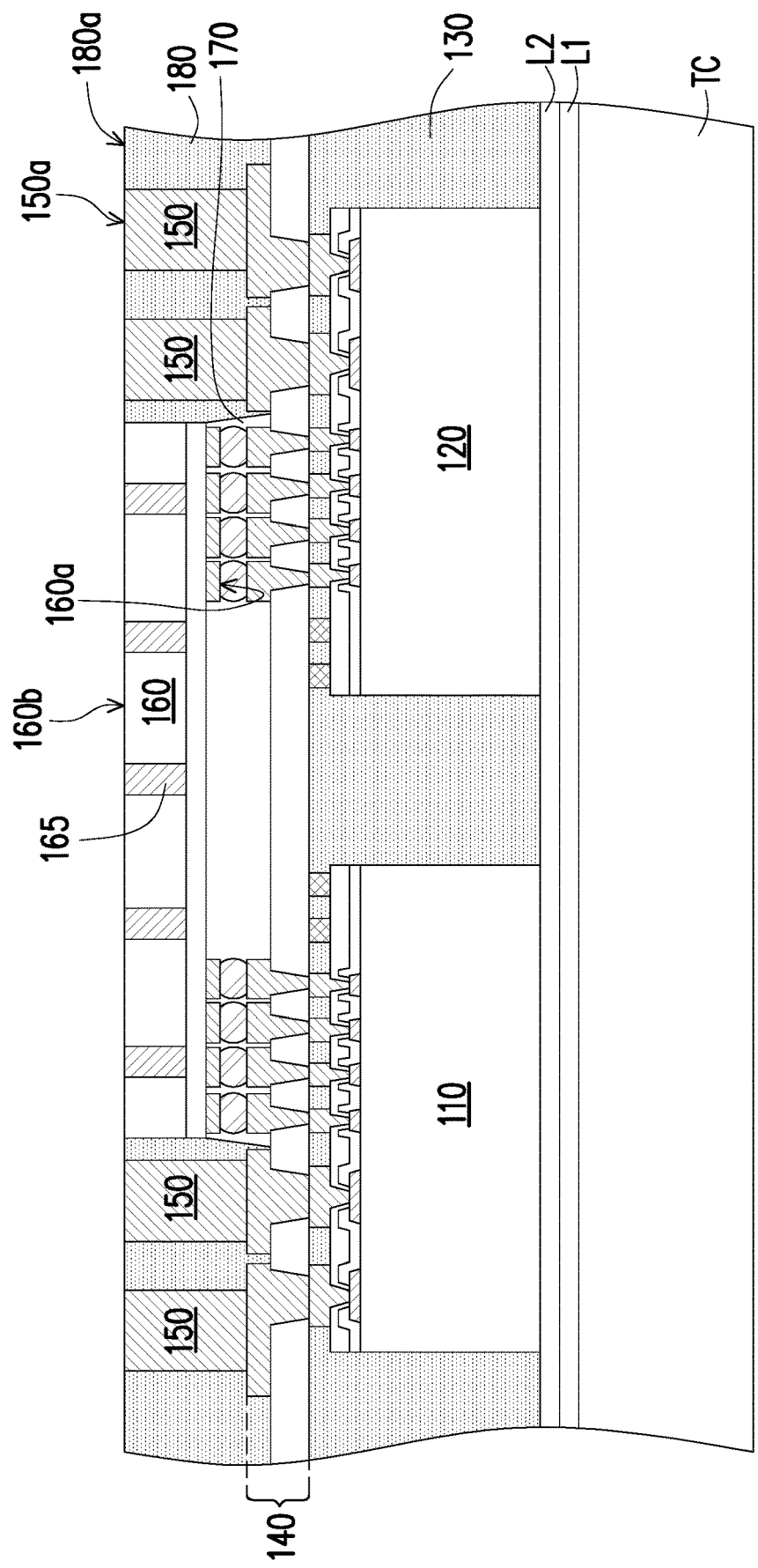
Figure 2F:
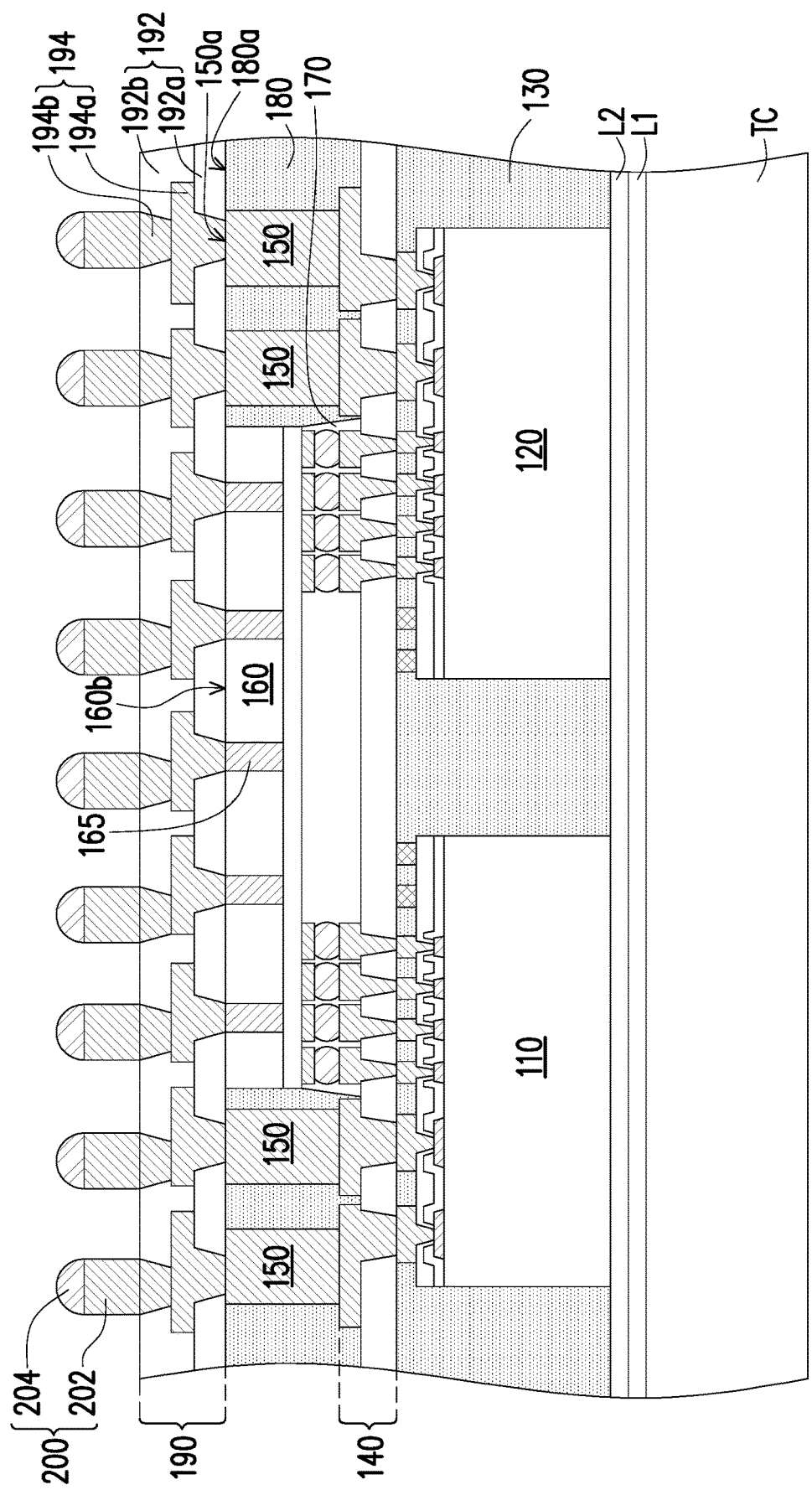
Figure 2G:
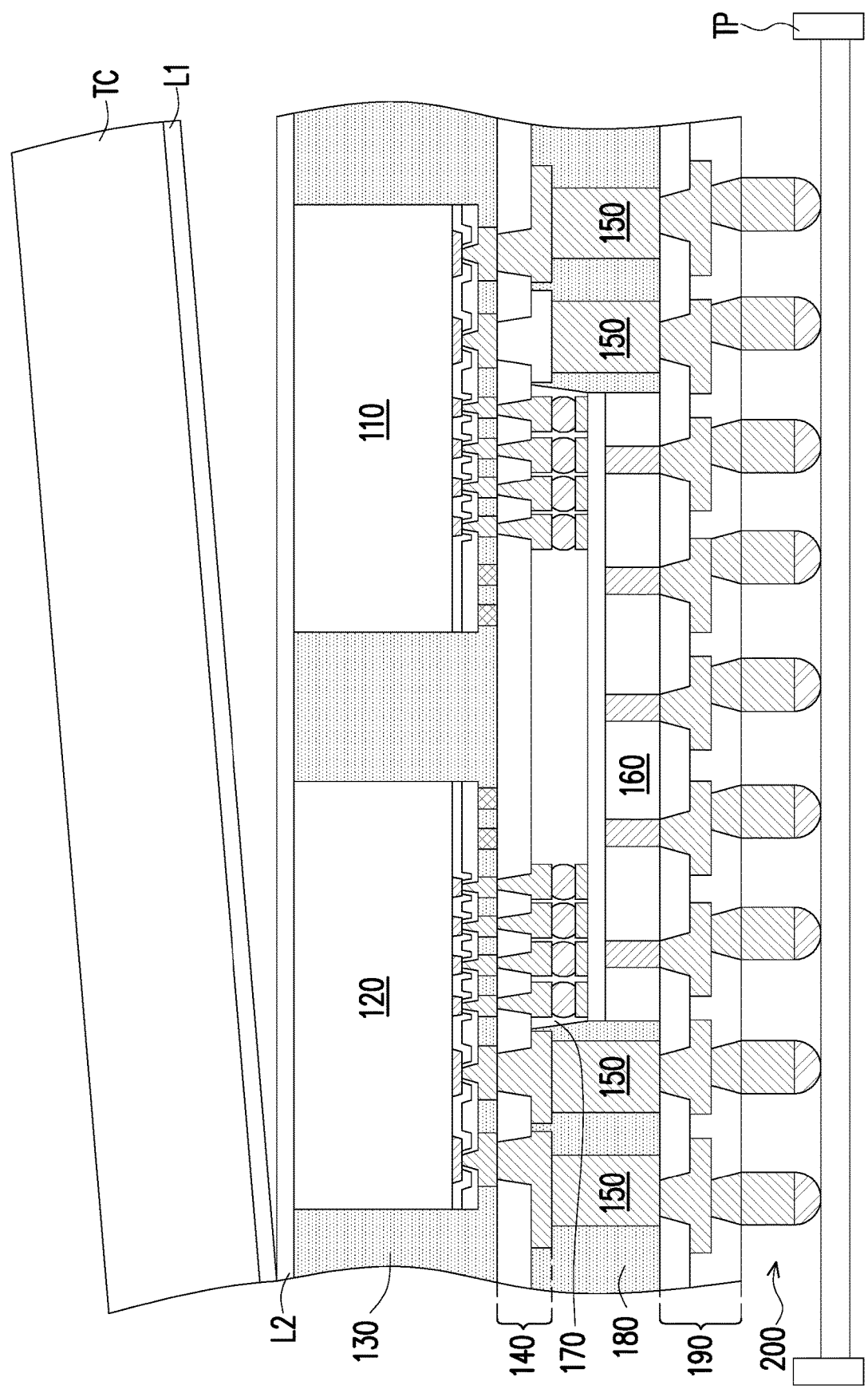
Figure 2H:
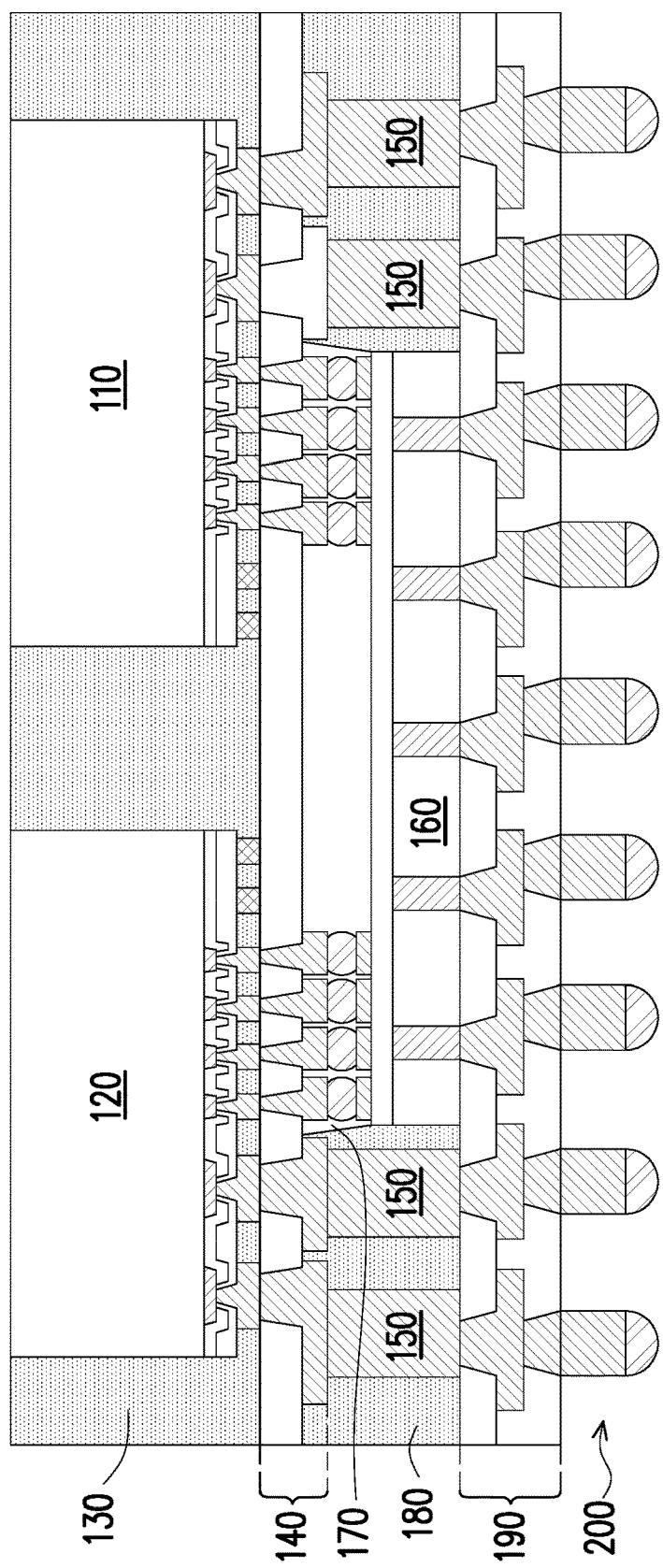
Figure 3:
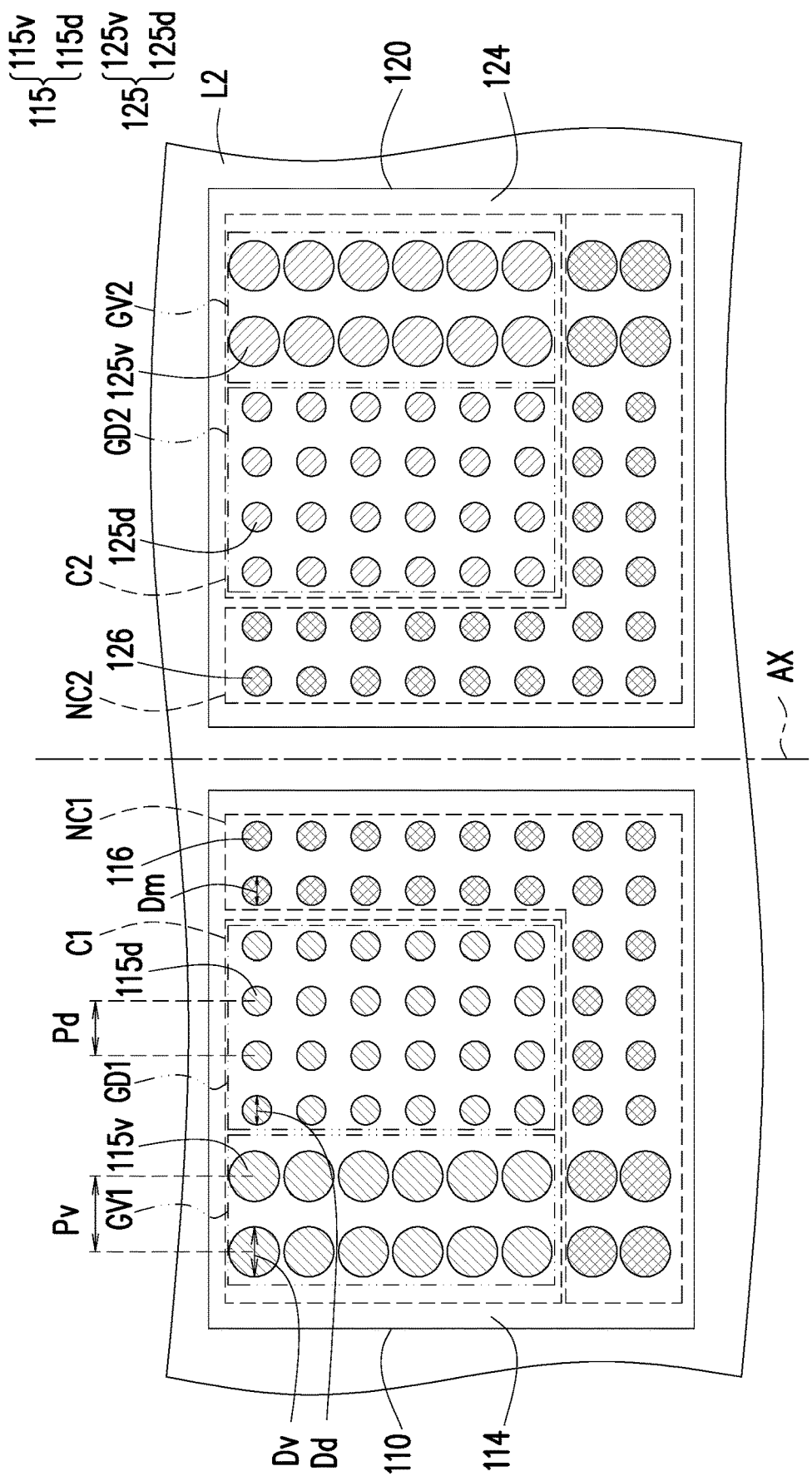
FIG. 3 is a schematic top view of FIG. 2A in accordance with some exemplary embodiments of the disclosure.

FIG. 2A to FIG. 2H are schematic cross-sectional views of various stages of manufacturing a semiconductor package in accordance with some exemplary embodiments of the disclosure, and FIG. 3 is a schematic top view of FIG. 2A in accordance with some exemplary embodiments of the disclosure. Referring to FIG. 2A and FIG. 3, a plurality of semiconductor dies is disposed on a temporary carrier TC. For example, a first semiconductor die 110 and a second semiconductor die 120 are picked and placed side by side on the temporary carrier TC. In some embodiments, the circuits in the first semiconductor die 110 are substantially identical to those of the second semiconductor die 120. Alternatively, the circuits in the first semiconductor die 110 and the second semiconductor die 120 are different from each other to perform different functions. The first semiconductor die 110 and/or the second semiconductor die 120 may be or may include a logic die, such as a central processing unit (CPU) die, a graphic processing unit (GPU) die, a micro control unit (MCU) die, an input-output (I/O) die, a baseband (BB) die, or an application processor (AP) die, etc. It should be appreciated that the number of semiconductor dies and the functions of semiconductor dies to be packaged may depend on the design requirements.

In some embodiments, the first semiconductor die 110 and the second semiconductor die 120 are singulated from the same semiconductor wafer (e.g., the semiconductor wafer W1 shown in FIG. 1A and FIG. 1B) and may perform same or similar functions. The functions may include memory structures, processing structures, sensors, amplifiers, power distribution, I/O circuitry, or the like. The formations of the first semiconductor die 110 and/or the second semiconductor die 120 may be the same as or similar to the semiconductor die 10 described in FIG. 1C. The materials and the characteristics of first/second semiconductor substrates 111/121, first/second conductive pads 112/122, first/second passivation layers 113/123, first/second post-passivation layer 114/124, first/second electrical connectors 115/125, and first/second dummy conductors 116/126 are the same as those of the semiconductor substrate 11, the conductive pads 12, the passivation layer 13, the post-passivation layer 14, the electrical connectors 15, and the dummy conductors 16 shown in FIG. 1C, and thus, the detailed descriptions are omitted herein for the sake of brevity. It should be noted that the first semiconductor die 110 and the second semiconductor die 120 are provided for illustrative purposes. In alternative embodiments, the first semiconductor die 110 and the second semiconductor die 120 are singulated from the different semiconductor wafers and may perform different functions.

Continue to FIG. 2A and FIG. 3, the first semiconductor die 110 may include a first contact region C1 and a first non-contact region NC1 in proximity to the first contact region C1. In some embodiments, the first non-contact region NC1 is the perimeter area of the first semiconductor die 110, and the first contact region C1 includes the inboard area of the first semiconductor die 110. The first electrical connectors 115 of the first semiconductor die 110 are disposed on the first contact region C1, and the first dummy conductor 116 of the first semiconductor die 110 are disposed on the first non-contact region NC1. The first electrical connectors 115 are electrically connected to the IC component formed in the first semiconductor substrate 111 of the first semiconductor die 110. The second semiconductor die 120 disposed aside the first semiconductor die 110 may include a second contact region C2 (e.g., where the second electrical connectors 125 are disposed on) and a second non-contact region NC2 (e.g., where the second dummy conductor 126 are disposed on) in proximity to the second contact region C2. The second electrical connectors 125 are electrically connected to the IC component formed in the second semiconductor substrate 121 of the second semiconductor die 120.

The first electrical connectors 115 may include a plurality of first via-connecting connectors 115$v$ classified in a first via-connecting group GV1, and a plurality of first die-connecting connectors 115$d$ classified in a first die-connecting group GD1. The first die-connecting group GD1 may be disposed between the first via-connecting group GV1 and the group of the first dummy conductors 116. In some embodiments, a distribution density of the first die-connecting connectors 115$d$ is denser than that of the first via-connecting connector 115$v$. For example, the first die-connecting connectors 115$d$ in the first die-connecting group GD1 may be micro-bumps for fine-pitch connection. The respective ones of first die-connecting connectors 115$d$ in the first die-connecting group GD1 may have substantially equal or similar diameters Dd. The respective ones of first via-connecting connectors 115$v$ in the first via-connecting group GV1 may have substantially equal or similar diameters Dv. The diameter Dv of respective ones of the first via-connecting connectors 115$v$ may be greater than or substantially equal to a diameter Dd of respective ones of the first die-connecting connectors 115$d$. In some embodiments, the first die-connecting connectors 115$d$ classified in the first die-connecting group GD1 have critical dimensions that are smaller or finer than the critical dimensions of the first via-connecting connectors 115$v$ classified in the first via-connecting group GV1. For example, a pitch Pd between the two most adjacent first die-connecting connectors 115d is finer than a pitch Pv between the two most adjacent first via-connecting connectors 115v. However, the critical dimensions of the first electrical connectors 115 may be adjusted depending on the design requirements, and construe no limitation in the disclosure.

A diameter Dm of one of the first dummy conductors 116 may be substantially equal to the diameter Dd of one of the first die-connecting connectors/first via-connecting connectors 115d/115v disposed aside the one of the first dummy conductors 116. The first dummy conductors 116 raise the metal density and/or pattern regularity of the first semiconductor die 110. After forming the first electrical connectors 115 and first dummy conductors 116 (e.g., after etching the seed layer as described above in FIG. 1B), the diameter Dm of one of the first dummy conductors 116 disposed at the edge of the first semiconductor die 110 may be smaller than the diameter Dd of one of the first electrical connectors 115 disposed in proximity to the one of the first dummy conductors 116. The first dummy conductors 116 are provided to alleviate the adverse impacts associated with the loading effect in the formation process of first electrical connectors 115 so that the uniformity of critical dimensions in both of the first via-connecting group GV1 and the first die-connecting group GD1 may be achieved.

In some embodiments, the second electrical connectors 125 may include a plurality of second via-connecting connectors 125v classified in a second via-connecting group GV2, and a plurality of second die-connecting connectors 125d classified in the second die-connecting group GD2. The configuration of the second via-connecting group GV2 and the second die-connecting group GD2 may be similar to that of the first via-connecting group GV1 and the first die-connecting group GD1, respectively. The first and second dummy conductors 116 and 126 are disposed between the arrays of the first and second electrical connectors 115 and 125. In some embodiments, at least a part of the first non-contact region NC1 of the first semiconductor die 110 and at least a part of the second non-contact region NC2 of the second semiconductor die 120 are disposed between the first contact region C1 of the first semiconductor die 110 and the second contact region C2 of the second semiconductor die 120 in a top view as shown in FIG. 3. In some embodiments, the first electrical connectors 115 disposed on the first contact region C1 are distributed from the center to the extremity within the circumference of the first semiconductor die 110 so that some of the first electrical connectors 115 are arranged along a portion of the edges of the first semiconductor die 110. The first electrical connectors 115 may be partially encircled by the first dummy conductors 116. In some embodiments, the first non-contact region NC1 may be an L-shaped region configured at the periphery of the first semiconductor die 110 to enclose at least two sides (e.g., connected to one another) of the first contact region C1. For example, the first dummy conductors 116 are laid out two outermost edges of the array of the first electrical connectors 115. In some embodiments, a distribution area of the first non-contact region NC1 is smaller than that of the first contact region C1.

Still referring to FIG. 3, in some embodiments, the arrays of the second electrical connectors 125 and the second dummy conductors 126 (e.g., respectively disposed on the second contact region C2 and the second non-contact region NC2) may be arranged in a in a mirror-symmetrical configuration with respective to a virtual axis AX between the first semiconductor die 110 and the second semiconductor die 120 in the top view. The mirror-symmetrical configuration may be the configuration with respective to the arrays of the first/second electrical connectors 115/125 and the first/second dummy conductors 116/126, for example, the arrangement of the array of the second electrical connectors 125 and the second dummy conductors 126 can essentially be mapped on the first semiconductor die 110 by reflection, vice versa. In some embodiments, when a perpendicular is constructed on the two-dimensional view as shown in FIG. 3, the virtual axis AX on the top view is the line such that any two points lying on the perpendicular at equal distances from the virtual axis are identical. In alternative embodiments, the arrays of the second electrical connectors 125 and the dummy conductors 126 respectively disposed on the second contact region C2 and the second non-contact region NC2 of the second semiconductor die 120 may be arranged in a asymmetrical configuration with respective to the first semiconductor die 110.

Still referring to FIG. 2A, after disposing the first semiconductor die 110 and the second semiconductor die 120, a gap is formed therebetween. In some embodiments, the first semiconductor die 110 and the second semiconductor die 120 are attached onto the temporary carrier TC through an adhesive layer L2. The temporary carrier TC may be a glass carrier, a ceramic carrier, or the like. The adhesive layer L2 may be a die attach film (DAF) or other suitable bonding layer. In some embodiments, the first semiconductor die 110 and the second semiconductor die 120 are disposed on the temporary carrier TC through a de-bonding layer L1. The de-bonding layer L1 is formed on the temporary carrier TC by a spin coating method or other suitable forming process, and the adhesive layer L2 may be disposed on the de-bonding layer L1. In some embodiments, the de-bonding layer L1 is formed of an adhesive such as Ultra-Violet (UV) glue, Light-to-Heat Conversion (LTHC) release layer, or other types of adhesives. In some embodiments, the de-bonding layer L1 is decomposable under external energy (e.g., the heat of light) to release the temporary carrier TC from the overlying structure that will be formed in subsequent steps.

Referring to FIG. 2B, a first insulating encapsulation 130 is formed over the temporary carrier TC to encapsulate the first semiconductor die 110 and the second semiconductor die 120. The first insulating encapsulation 130 includes a molding compound (e.g., epoxy resins), a molding underfill, a dielectric material (e.g., polybenzoxazole, polyimide, benzocyclobutene, a combination thereof), or other suitable electrically insulating materials. In an exemplary embodiment, the method of forming the first insulating encapsulation 130 includes at least the following steps. An insulating material (not shown) is formed over the temporary carrier TC so that the first semiconductor die 110 and the second semiconductor die 120 may be over-molded, and the gap between the first semiconductor die 110 and the second semiconductor die 120 may be filled. Next, a thinning process is performed on the insulating material to reduce the thickness of the insulating material until at least a portion of the first electrical connectors 115 of the first semiconductor die 110 and at least a portion of the second electrical connectors 125 of the second semiconductor die 120 are accessibly revealed for further electrical connection.

In some embodiments, the surface that the first electrical connectors 115 are accessibly revealed may be referred to as an active surface 110a of the first semiconductor die 110. Similarly, the surface that the second electrical connectors 125 are accessibly revealed may be referred to as an active surface 120a of the second semiconductor die 120. In some embodiments, a portion of the first dummy conductors 116 and a portion of the second dummy conductors 126 may be also accessibly revealed by the insulating material after thinning. In such embodiments, both of the first electrical connectors 115 and the first dummy conductors 116 are accessibly distributed on the active surface 110a of the first semiconductor die 110. Alternatively, only first electrical connectors 115 are revealed, whilst the first dummy conductors 116 are embedded in the first insulting encapsulation 130, and the first dummy conductors 116 are electrically floating. Similarly, both of the second electrical connectors 125 and the second dummy conductors 126 may be accessibly distributed on the active surface 120a of the second semiconductor die 120, or only second electrical connectors 125 are revealed for further electrical connection, whilst the second dummy conductors 126 are embedded in the first insulting encapsulation 130, and the second dummy conductors 126 are electrically floating.

For example, the thinning process includes a grinding process, a chemical mechanical polishing (CMP) process, and/or a planarization process, or other suitable removing process. A cleaning step is optionally performed after thinning to clean and remove the residues generated during the thinning process. After reducing the thickness of the insulating material, the first insulating encapsulation 130 is formed. It should be noted that the process of forming the first insulating encapsulation 130 may be performed through any other suitable techniques, which is not limited thereto.

Continue to FIG. 2B, the first electrical connectors 115, the first dummy conductors 116, the second electrical connectors 125, and the second dummy conductors 126 may be laterally encapsulated by the first insulating encapsulation 130. For example, the first insulating encapsulation 130 is formed on the sidewalls of the first/second semiconductor die 110/120 and on the first/second post-passivation layer 114/124 to fill the space thereon. The first insulating encapsulation 130 may fill the space among the array of the first electrical connectors 115, the space among the first dummy conductors 116, the space between the array of the first electrical connectors 115 and the group of first dummy conductors 116, the space among the array of the second electrical connectors 125, the space among the second dummy conductors 126, the space between the array of the second electrical connectors 125 and the second dummy conductors 126. A top surface 130a of the first insulating encapsulation 130 may be substantially coplanar with the active surface 110a of the first semiconductor die 110 and the active surface 120a of the second semiconductor die 120. In some embodiments, the top surface 130a of the first insulating encapsulation 130, the active surface 110a of the first semiconductor die 110, the active surface 120a of the second semiconductor die 120 may be substantially coplanar. In some embodiments, top surfaces of the first dummy conductors 116 and top surfaces of the second dummy conductors 126 are substantially flush with the top surface 130a of the first insulating encapsulation 130.

In certain embodiments in which the protection layers encapsulate the first/second electrical connectors 115/125 and the first/second dummy conductors 116/126 for protection, at least the protection layers of the first/second semiconductor die 110/120 covering on the active surfaces 110a and 120a may be removed during the thinning process so as to reveal the first/second electrical connectors 115/125 for further electrical connection. In such embodiments, the first/second electrical connectors 115/125 and the first/second dummy conductors 126 are laterally encapsulated by the protection layers, and the first insulating encapsulation 130 laterally encapsulates the protection layers.

Referring to FIG. 2C, a first redistribution structure 140 is formed on the top surface 130a of the first insulating encapsulation 130, the active surface 110a of the first semiconductor die 110, and the active surface 120a of the second semiconductor die 120. For example, the first redistribution structure 140 includes a first patterned dielectric layer 142 and a first patterned conductive layer 144. In an exemplary embodiment, the method of forming the first redistribution structure 140 includes at least the following steps. A dielectric material (e.g., polybenzoxazole, polyimide, benzocyclobutene, or other suitable material that is electrically insulating) is formed over the top surface 130a of the first insulating encapsulation 130, the active surface 110a of the first semiconductor die 110, and the active surface 120a of the second semiconductor die 120 using a spin-coating process, a deposition process, or other suitable process. Next, a portion of the dielectric material is removed to form the first patterned dielectric layer 142 having a plurality of openings using lithography and etching technique or other suitable removing process. The openings of the first patterned dielectric layer 142 may expose at least a portion of the first electrical connectors 115 of the first semiconductor die 110 and at least a portion of the second electrical connectors 125 of the second semiconductor die 120. The first dummy conductors 116 and the second dummy conductors 126 may remain covered by the first patterned dielectric layer 142. Subsequently, a conductive material (e.g., a metal or a metal alloy such as copper, silver, gold, tungsten, cobalt, aluminum, or alloys thereof) is formed over the surface of the first patterned dielectric layer 142 and fills in the openings of the first patterned dielectric layer 142, and then the conductive material is patterned to form the first patterned conductive layer 144 through patterning and metallization techniques (e.g., deposition of seed layer, lithography, plating, etching, etc.). It is appreciated that the number of the patterned dielectric layer(s) and the patterned conductive layer(s) depends on the circuit design and is not limited by the disclosure. Other suitable techniques may be utilized to form the first redistribution structure 140.

The first patterned conductive layer 144 may include various conductive features (e.g., lines, vias, pads, etc.). The first patterned conductive layer 144 may penetrate through the first patterned dielectric layer 142 to be in physical and electrical contact with the first electrical connectors 115 of the first semiconductor die 110 and the second electrical connectors 125 of the second semiconductor die 120. A portion of the first patterned conductive layer 144 in contact with the first die-connecting group GD1 and the second die-connecting group GD2 may have a finer pitch pattern than another portion of the first patterned conductive layer 144 in contact with the first via-connecting group GV1 and the second via-connecting group GV2. The first dummy conductors 116 and the second dummy conductors 126 may be remote from the first patterned conductive layer 144 and may be electrically insulated from all conductive features in the first redistribution structure 140. In some embodiments, the first dummy conductors 116 and the second dummy conductors 126 are electrically floating.

In some embodiments, each first dummy conductor 116 of the first semiconductor die 110 is longitudinally insulated by the first redistribution structure 140 and the post-passivation layer 114 of the first semiconductor die 110, and may be laterally insulated by the first insulating encapsulation 130. For example, each first dummy conductor 116 includes a first surface 116a covered by the first patterned dielectric layer 142, a second surface 116b opposite to the first surface 116a and covered by the post-passivation layer 114, and sidewalls 116c connected to the first surface 116a and the second surface 116b and covered by the first insulating encapsulation 130 (or the protection layer of the first semiconductor die 110 in certain embodiments). The second dummy conductors 126 may have similar configuration to the first dummy conductors 116, and thus the detailed descriptions are omitted for brevity.

Referring to FIG. 2D, one or more conductive connectors 150 may be formed on the first redistribution structure 140. A material of the conductive connectors 150 includes copper, nickel, solder, a combination thereof, or the like. In some embodiments, the method of forming the conductive connectors 150 includes the following steps. A photoresist layer with openings (not shown) is formed on the first redistribution structure 140, and the openings of the photoresist layer may expose the intended locations of the first patterned conductive layer 144 for the subsequently formed conductive connectors 150. Next, a plating process or other suitable deposition process may be performed to form a metallic layer in the openings of the photoresist layer, and then the photoresist layer is removed so that the conductive connectors 150 are formed to be in physical and electrical contact with the first patterned conductive layer 144 of the first redistribution structure 140. The conductive connectors 150 may be electrically coupled to the first semiconductor die 110 and the semiconductor second die 120 through the first redistribution structure 140. In some embodiments, the conductive connectors 150 correspond to the first via-connecting connectors 115v of the first semiconductor die 110 and the second via-connecting connectors 125v of the second semiconductor die 120 through the first redistribution structure 140. It is appreciated that the number and the position of the conductive connectors 150 are variable and may be modified in demand.

Continue to FIG. 2D, a third semiconductor die (or may be referred to as a package component) 160 is disposed on the first redistribution structure 140. For example, after forming the conductive connectors 150, the third semiconductor die 160 is picked and placed on the first redistribution structure 140. In some embodiments, the third semiconductor die 160 is surrounded by the conductive connectors 150 after disposing. The third semiconductor die 160 may extend over the gap between the first semiconductor die 110 and the second semiconductor die 120. The third semiconductor die 160 may be the same type or the different types of semiconductor dies with respective to the first semiconductor die 110 and/or the second semiconductor die 120. In some embodiments, the third semiconductor die 160 includes a third semiconductor substrate 162, a device layer 163 disposed on the third semiconductor substrate 162, and die connectors 164 connected to the device layer 163. The device layer 163 may include a wide variety of IC components (not shown; such as active components (e.g., diodes, transistors, optoelectronic devices, etc.), and/or passive components (e.g., resistors, capacitors, inductors, etc.)) formed in the third semiconductor substrate 162. The die connectors 164 arranged in a fine pitch manner may correspond to the first die-connecting connectors 115d of the first semiconductor die 110 and the second die-connecting connectors 125d of the second semiconductor die 120 through the first redistribution structure 140. The side where the die connectors 164 are distributed may be referred to as the front side 160a of the third semiconductor die 160.

The third semiconductor die 160 may be disposed in a flip-chip manner. For example, solder materials are formed on the die connectors 164, and then after disposing the third semiconductor die 160 on the first patterned conductive layer 144, a reflow process may be performed to mount the third semiconductor die 160 on the first redistribution structure 140. In some embodiments, after disposing the third semiconductor die 160, the front side 160a of the third semiconductor die 160 is connected to the first redistribution structure 140 and faces toward the active surface 110a of the first semiconductor die 110 and the active surface 120a of the second semiconductor die 120. In some embodiments, the third semiconductor die 130 includes through semiconductor vias (TSVs) 165 embedded in the third semiconductor substrate 162, and TSVs 165 may be in electrical contact with the device layer 163. In alternative embodiments, the third semiconductor die 160 is a bridge structure (e.g., a silicon bridge) for providing a shorter electrical connection path between the first semiconductor die 110 and the second semiconductor die 120, and the detailed descriptions will be described later in other embodiments.

Still referring to FIG. 2D, an underfill 170 is optionally formed between the third semiconductor die 160 and the first redistribution structure 140. For example, a liquid organic material (e.g., epoxy mixture) is initially dispensed into the gap between third semiconductor die 160 and the first redistribution structure 140, and then a curing process is performed to harden the liquid organic material so as to form the underfill 170. Other suitable materials (e.g., deformable gel, silicon rubber, or the like) may be utilized as the underfill 170. The underfill 170 may cover the die connectors 164 of the third semiconductor die 160 and the first patterned conductive layer 144 of the first redistribution structure 140, thereby strengthening the attachment and preventing the thermal stresses from breaking the connection therebetween. In some embodiments, an excess amount of the underfill 170 climbs up to cover the sidewalls of the third semiconductor die 160. It should be noted that the foregoing sequence merely serves as an illustrative example, and the disclosure is not limited thereto. Alternatively, the third semiconductor die 160 is disposed prior to the step of forming the conductive connectors 150. In alternative embodiments, the conductive connectors 150 are omitted.

Referring to FIG. 2E, a second insulating encapsulation 180 is formed on the first redistribution structure 140 to encapsulate the conductive connectors 150, the third semiconductor die 160, and the underfill 170. The forming process and the material of the second insulating encapsulation 180 may be similar to those of the first insulating encapsulation 130. In some embodiments, the conductive connectors 150, the third semiconductor die 160, and the underfill 170 are initially over-molded by the insulating material. Subsequently, a thinning process is performed to reduce the thickness of the insulating material until at least a portion of the conductive connectors 150 is accessibly revealed to form the second insulating encapsulation 180. In some embodiments, after forming the second insulating encapsulation 180, the conductive connectors 150 penetrate through the second insulating encapsulation 180 for further electrical connection. The conductive connectors 150 may be referred to as the through insulating vias in accordance to some embodiments. During the thinning process, the conductive connectors 150 and/or the third semiconductor die 160 may be slightly removed. In certain embodiments, the third semiconductor die 160 is grinded along with the insulating material until the TSVs 165 are accessibly revealed on a rear side 160b (e.g., opposite to the front side 160a) for further electrical connection. After forming the second insulating encapsulation 180, a planarizing process is optionally performed on the second insulating encapsulation 180 and/or the conductive connectors 150 and/or the third semiconductor die 160 to render a substantially flat surface. For example, a top surface 180a of the second insulating encapsulation 180 may be substantially coplanar with the rear side 160b of the third semiconductor die 160 and the top surfaces 150a of the conductive connectors 150.

Alternatively, the second insulating encapsulation 180 is formed prior to the formation of the conductive connectors 150. For example, after disposing the third semiconductor die 160, the second insulating encapsulation 180 is formed on the first redistribution structure 140 to wrap the third semiconductor die 160. Subsequently, portions of the second insulating encapsulation 180 may be removed to form through holes exposing the intended locations of the first redistribution structure 140. Afterwards, a conductive material may be formed in the through holes of the second insulating encapsulation 180 to form the conductive connectors 150.

Referring to FIG. 2F, a second redistribution structure 190 is formed on the top surface 180a of the second insulating encapsulation 180, the rear side 160b of the third semiconductor die 160, and the top surfaces 150a of the conductive connectors 150. A plurality of conductive contacts 200 are formed on the second redistribution structure 190 for further electrical connection. For example, the second redistribution structure 190 is in physical and electrical contact with the conductive connectors 150 and/or the TSVs 165 of the third semiconductor die 160. The second redistribution structure 190 may include a second patterned dielectric layer 192 and a second patterned conductive layer 194. For example, a plurality of polymer sublayers (e.g., 192a, 192b) and a plurality of metallic sublayers (e.g., 194a, 194b) are stacked alternately to form the second redistribution structure 190. The number of the polymer sublayers and/or the metallic sublayers may be adjusted depending on the circuit design, which is not limited by the disclosure. In some embodiments, the polymer sublayers 192a and 192b are made of the same dielectric material, and the polymer sublayers 192a and 192b may be collectively viewed as the second patterned dielectric layer 192. The metallic sublayers 194a and 194b may be collectively viewed as the second patterned conductive layer 194.

The forming process and the materials of the second redistribution structure 190 may be similar to those of the first redistribution structure 140, and details thereof are simplified for brevity. For example, the polymer sublayer 192a having a plurality of openings is formed over the top surface 180a of the second insulating encapsulation 180, the rear side 160b of the third semiconductor die 160, and the top surfaces 150a of the conductive connectors 150. The openings of the polymer sublayer 192a may expose at least a portion of the conductive connectors 150 and/or at least a portion of the TSVs 165 of the third semiconductor die 160. Next, a conductive material is formed and patterned to form the metallic sublayer 194a on the surface of the polymer sublayer 192a and inside the openings of the polymer sublayer 192a to be in physical and electrical contact with the conductive connectors 150 and/or the TSVs 165 of the third semiconductor die 160. Subsequently, the polymer sublayer 192b is formed over the polymer sublayer 192a to cover the metallic sublayer 194a. The polymer sublayer 192b may have a plurality of openings exposing at least a portion of the metallic sublayer 194a. In some embodiments, the metallic sublayer 194b is formed in the openings of the polymer sublayer 192b to be in physical and electrical contact with the underlying metallic sublayer 194a. In some embodiments, the metallic sublayer 194b includes connecting pads or under-ball metallurgy (UBM) pattern (not shown) for further electrical connection.

Continue to FIG. 2F, the conductive contacts 200 are subsequently formed on the metallic sublayer 194b of the second redistribution structure 190. The conductive contacts 200 are electrically connected to the first semiconductor die 110 and the second semiconductor die 120 at least through the first/second redistribution structures 140 and 190 and the conductive connectors 150. In some embodiments, the conductive contacts 200 are electrically connected to the third semiconductor die 160 through the second redistribution structure 190. The conductive contacts 200 may be made of a conductive material with low resistivity (e.g., copper, nickel, tin, silver, lead, an alloy thereof, or the like), and may be formed by a suitable process (e.g., evaporation, plating, ball drop, screen printing, a ball mounting process, etc.). In some embodiments, each conductive contact 200 includes a metallic pillar 202 (e.g. a copper pillar). The metallic pillars 202 may be formed by other deposition method, such as sputtering, printing, chemical vapor deposition (CVD), or the like. In some embodiments, the metallic pillars 202 are formed at the process (e.g., electro-plating, electroless-plating, immersion plating, or the like) along with the underlying metallic sublayer 194b of the second redistribution structure 190. The metallic pillars 202 may be made of non-reflowable material (e.g., solder-free materials) and have substantially vertical sidewalls with respective to the polymer sublayer 192b of the second redistribution structure 190. In some embodiments, a metallic cap 204 is formed on the top of the respective metallic pillar 202. The metallic cap 204 may be formed of solder materials (e.g., a Sn—Ag alloy, a Sn—Cu alloy, a Sn—Ag—Cu alloy, or the like), and may be lead-free or lead-containing.

Alternatively, the conductive contacts 200 may be solder bumps formed on the connecting pads (or UBM pattern) of the underlying second redistribution structure 190. For example, a solder material layer may be formed on the underlying second redistribution structure 190 through a suitable method, such as evaporation, electroplating, printing, solder transfer, ball placement, or the like, and then a reflow process is optionally performed to shape the solder material into the desired bump shapes so as to form the conductive contacts 200. It will be appreciated that the conductive contacts 200 may be formed according to a variety of shapes, sizes, or configurations, and are not limited to the examples illustrated herein.

Referring to FIG. 2G and FIG. 2H, after forming the conductive contacts 200, the structure shown in FIG. 2F may be placed on a holder TP, and the temporary carrier TC may be detached and removed. For example, the structure shown in FIG. 2F is overturned (e.g., turned upside down) to be placed on the holder TP, and then the de-bonding process of the temporary carrier TC may be performed. For example, the de-bonding layer L1 (e.g., the LTHC release layer) is irradiated with a UV laser so that the temporary carrier TC and the de-bonding layer L1 can be peeled off from the underlying structure. Nevertheless, the de-bonding process of the temporary carrier TC is not limited thereto. In some embodiments, after removing the temporary carrier TC and the de-bonding layer L1, the adhesive layer L2 (e.g., DAF) is left on the structure. In such embodiments, an additional removal process may be performed to remove the adhesive layer L2, and a cleaning step is optionally performed on the surface of the structure after the removal of the adhesive layer L2. In alternative embodiments, the adhesive layer L2 is removed along with the de-bonding layer L1 and the temporary carrier TC.

In some embodiments, the structure shown in FIG. 2G is singulated or separated at singulation lines (not shown) for forming individual semiconductor packages SP1 as illustrated in FIG. 2H. In some embodiments, the aforementioned steps are performed at wafer level, and the singulation process may involve performing a wafer dicing process. For example, the dicing or singulation process is a laser cutting process, a mechanical cutting process, or other suitable process. To perform the singulation process, the holder TP may be applied to the conductive contacts 200 as shown in FIG. 2G. The holder TP may be a dicing tape that may support the structure during the singulation process. Alternatively, after forming the conductive contacts 200, the singulation process may be performed to dice the structure illustrated in FIG. 2F along the singulation lines, and then the singulated structures are placed on the holder TP for subsequent processes.

Figure 4:
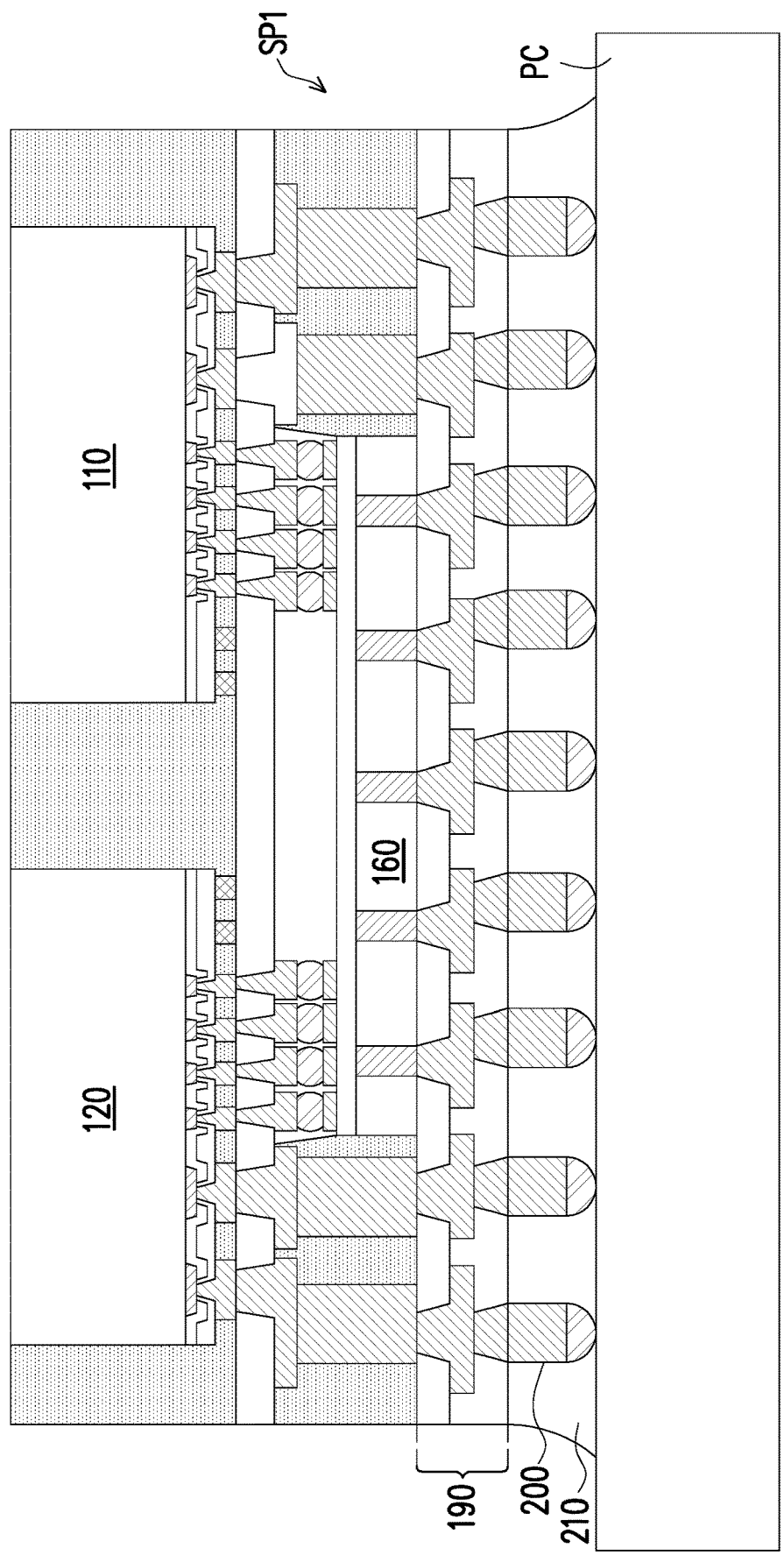
FIG. 4 is a schematic cross-sectional view illustrating an application of a semiconductor package according to some exemplary embodiments of the disclosure.

FIG. 4 is a schematic cross-sectional view illustrating an application of a semiconductor package according to some exemplary embodiments of the disclosure. Referring to FIG. 4, the semiconductor package SP1 as shown in FIG. 2H may be mounted onto a package component PC. The package component PC may include an interposer (with or without active/passive devices), another semiconductor package, a device die, a mounting substrate, a packaging substrate, a circuit board, combinations thereof, or the like. The electrical signals of the semiconductor dies (e.g., 110, 120, and/or 160) in the semiconductor package SP1 may be transmitted through the conductive contacts 200 to the package component PC. For example, the conductive contacts 200 of the semiconductor package SP1 are placed on the contact pads (not shown) of the package component PC, and then a reflow process may be performed to bond the semiconductor package SP1 to the package component PC. In some embodiments, an underfill 210 is optionally formed to fill in a space defined by the conductive contacts 200 of the semiconductor package SP1 and the package component PC, thereby improving the attachment therebetween.

Figure 5A:
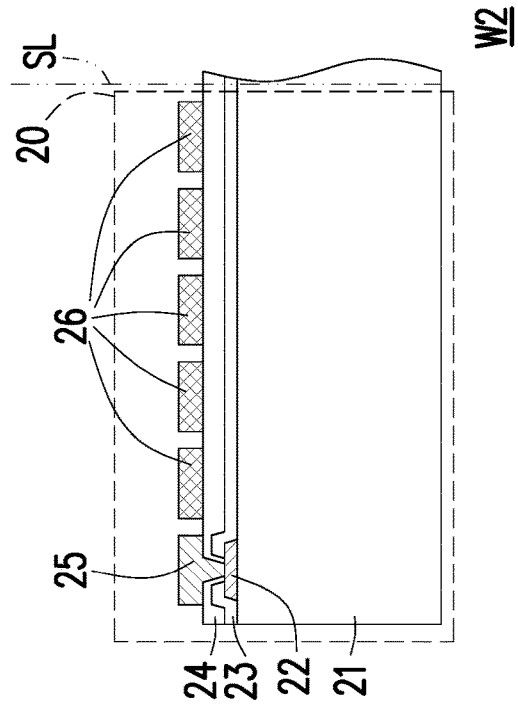
FIG. 5A to FIG. 5C are schematic cross-sectional views of various stages of manufacturing a semiconductor die in accordance with some exemplary embodiments of the disclosure.
Figure 5B:
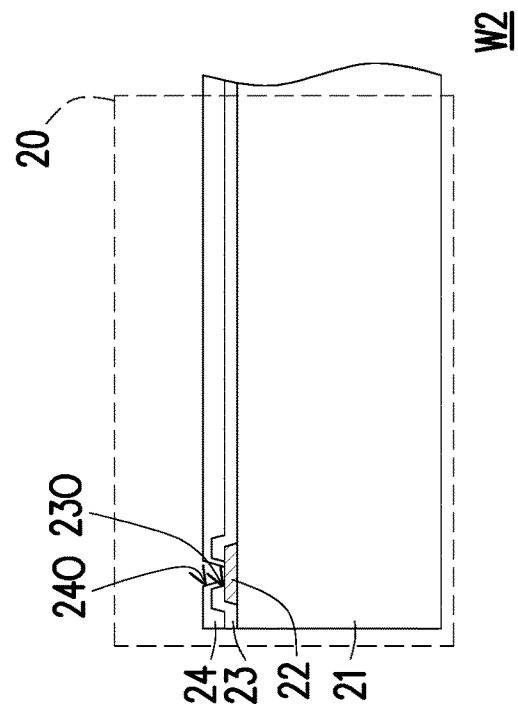
Figure 5C:
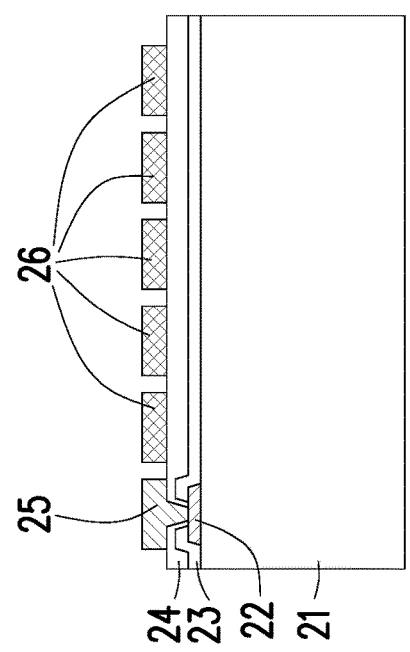

FIG. 5A to FIG. 5C are schematic cross-sectional views of various stages of manufacturing a semiconductor die in accordance with some exemplary embodiments of the disclosure. Referring to FIG. 5A, a semiconductor wafer W2 including semiconductor dies 20 is provided. The semiconductor dies 20 may have circuits identical to each other. In some embodiments, the semiconductor wafer W2 is a memory wafer, and the semiconductor dies 20 are memory device dies (e.g., Dynamic Random Access Memory (DRAM) dies, Static Random Access Memory (SRAM) dies, Magneto-resistive Random Access Memory (MRAM) dies, hybrid memory (HBM) cube dies, combinations thereof, or the like). The semiconductor wafer W2 may include other device dies for different applications in accordance with other embodiments. Before performing a wafer dicing process on the semiconductor wafer W2, the semiconductor dies 20 of the semiconductor wafer W2 may be physically connected to one another. In some embodiments, the semiconductor wafer W2 is manufactured through a FEOL process. However, the disclosure is not limited thereto. It should be appreciated that the illustration of the semiconductor wafer W2 and other components throughout all figures is schematic and is not in scale.

In some embodiments, the semiconductor wafer W2 includes a semiconductor substrate 21, a plurality of conductive pads 22 formed over the semiconductor substrate 21, and a passivation layer 23 formed over the semiconductor substrate 21 and having a plurality of contact openings 230. The conductive pads 22 may be partially exposed by the contact openings 230 of the passivation layer 23. The semiconductor substrate 21 may be a silicon substrate including IC components (not shown) formed therein. The semiconductor substrate 21 may include the semiconductor material similar to the semiconductor substrate 11 of the semiconductor wafer W1 as described in FIG. 1A. The IC components may include IC interconnections, active components (e.g., transistors or the like) and/or passive components (e.g., resistors, capacitors, inductors or the like). The conductive pads 22 may be aluminum pads, copper pads or other suitable metal pads. The semiconductor wafer W2 optionally includes a post-passivation layer 24 formed on the passivation layer 23 and having a plurality of contact openings 240. The conductive pads 22 partially exposed by the contact openings 230 of the passivation layer 23 are partially exposed by the contact openings 240 of the post-passivation layer 24. The materials of the passivation layer 23 and the post-passivation layer 24 may be similar to those of the passivation layer 13 and the post-passivation layer 14 as described in FIG. 1A.

Referring to FIG. 5B and FIG. 5C, a plurality of electrical connectors 25 are formed on the conductive pads 22, and a plurality of dummy conductors 26 are formed on the post-passivation layer 24. In some embodiments, the electrical connectors 25 and the dummy conductors 26 are formed during the same process. The materials and the forming processes of the electrical connectors 25 and the dummy conductors 26 may be similar to those of the electrical connectors 15 and the dummy conductors 16 described in FIG. 1B and FIG. 1C, and the detailed descriptions are omitted for brevity. The spacing or pitch between the electrical connectors 25 may be in a range of 10 μm to about 100 μm approximately. In some embodiments, the dummy conductors 26 may have similar shapes/pitches/critical dimensions to the electrical connectors 25 configured aside the dummy conductors 26. For example, the dummy conductors 26 are electrically isolated form all conductive features of the corresponding semiconductor die 20.

In some embodiments, the semiconductor substrate 21 includes a peripheral region and the rest region connected to the peripheral region in a top view (not shown). For example, the electrical connectors 25 are distributed corresponding to the peripheral region of the semiconductor substrate 21, and the dummy conductors 26 are distributed corresponding to the rest region. Although only one electrical connector 25 is shown in FIG. 5B and FIG. 5C, more than one electrical connector 25 may be arranged in a row at an extremity of a side of each semiconductor die 20 for the subsequently-formed elements as will be described later in other embodiments. In certain embodiments, the electrical connectors 25 formed at a single side of each semiconductor die 20 may result in undesired issues during the subsequent processing. For example, the semiconductor die may be unbalanced or tilted during a pick and place process. By distributing the dummy conductors 26 on the rest region other than the peripheral region (where the electrical conductors 25 are disposed on), the center of mass of each semiconductor die 20 may be adjusted to eliminate the die-tilting issue during a die-transferring process.

The dummy conductors 26 may be arranged in a pattern and disposed aside the electrical connectors 25. For example, the multiple electrical connectors 25 are arranged as a row adjacent the extremity of one of the semiconductor dies 20. The dummy conductors 26 may be formed as an array aside the row of the corresponding electrical connectors 25. The dummy conductors 26 may raise the metal density and pattern regularity in the open areas of the semiconductor dies 20. The dummy conductors 26 may have the same or similar pitch or spacing to the electrical connectors 25. It should be appreciated that the spacing or pitch between the dummy conductors 26 is feasible, for instance, the spacing or pitch between the dummy conductors 26 is different from that of the electrical connectors 25. The dummy conductors 16 may be laid out in several manners, and may have several shapes. In some embodiments, the dummy conductors 26 include different shapes than the electrical connectors 25. The dummy conductors 26 may be formed from polygon, square, rectangle, round, or other shapes. In some embodiments, the dummy conductors 26 (e.g., in the form of strips, a sheet, or the like) are laid out in the open area aside the electrical connectors 25. The dummy conductors 26 may cover a wider distribution area of the semiconductor die 20 than the electrical connectors 25. Other dummy conductor layouts are also possible. It should be appreciated that the electrical connectors 25 and the dummy conductors 26 depicted in FIG. 5A to FIG. 5C are merely one exemplary configuration, and other configurations are possible.

In some embodiments, after forming the electrical connectors 25 and the dummy conductors 26, a wafer dicing process may be performed on the semiconductor wafer W2 along singulating lines SL to separate individual semiconductor dies 20 from one another as shown in FIG. 5C. After performing a singulation process, each one of the semiconductor dies 20 may include the semiconductor substrate 21, the conductive pads 22 formed on the semiconductor substrate 21, the passivation layer 23 partially covering the conductive pads 22, the post-passivation layer 24 disposed on the passivation layer 23 and partially covering the conductive pads 22, the electrical connectors 25 connected to the conductive pads 22, and the dummy conductors 26 disposed aside the electrical connectors 25 and in contact with the post-passivation layer 24.

Figure 6A:
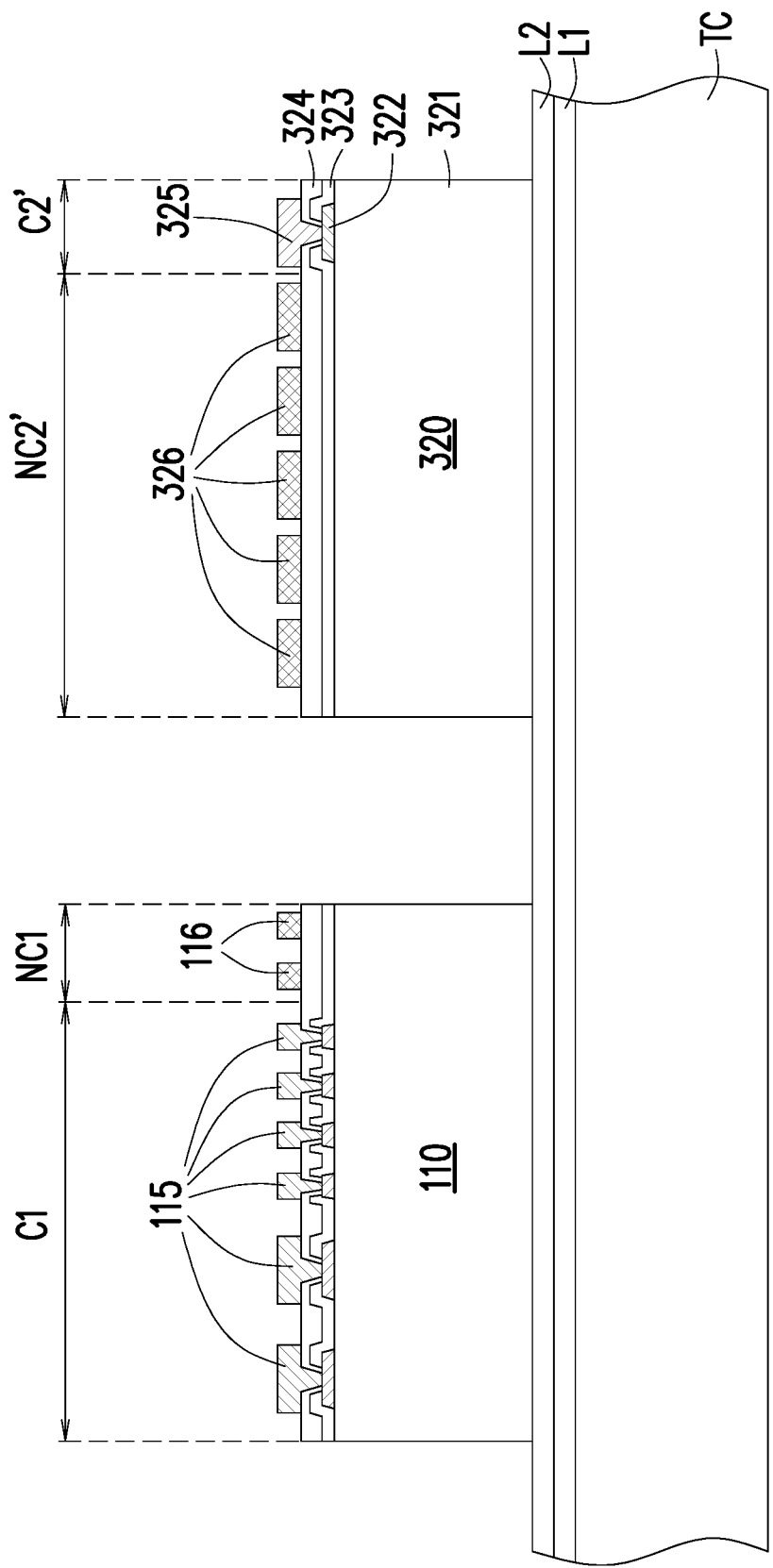
FIG. 6A to FIG. 6E are schematic cross-sectional views of various stages of manufacturing a semiconductor package in accordance with some exemplary embodiments of the disclosure.
Figure 6B:
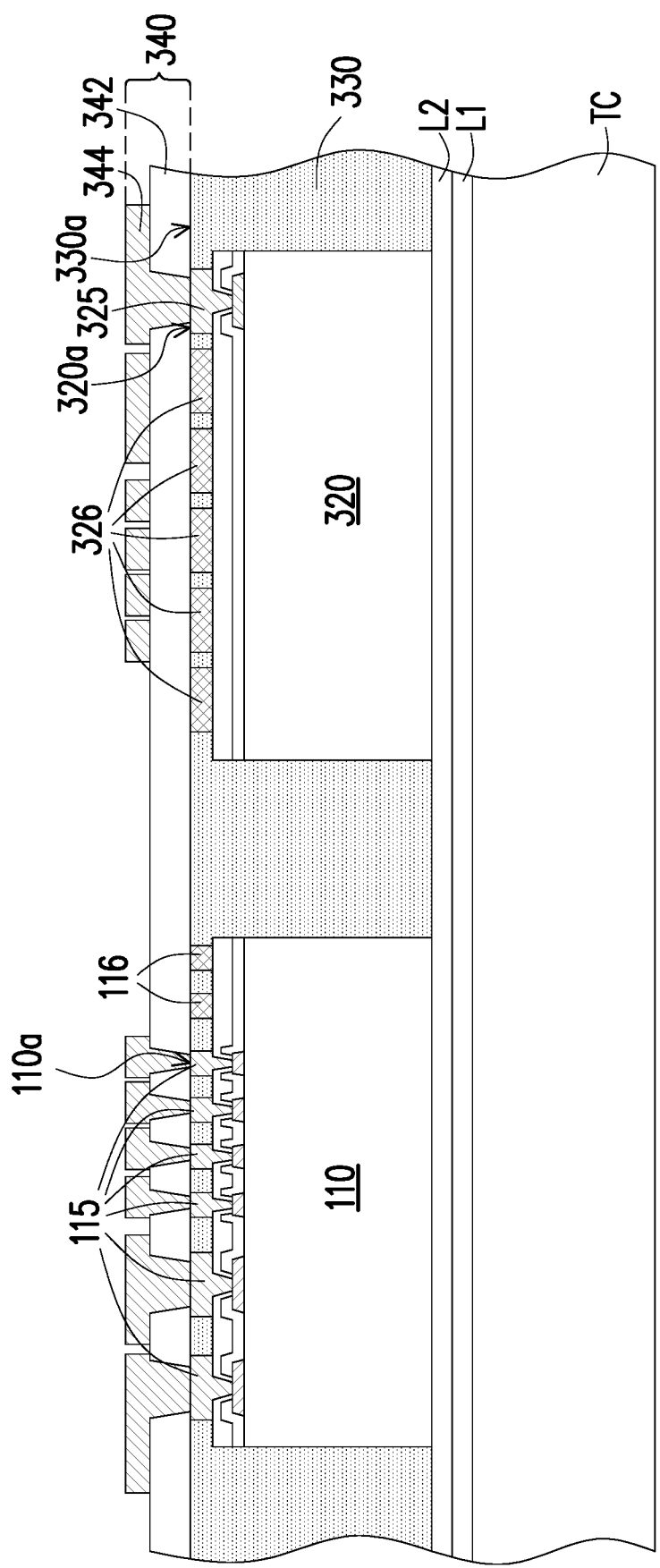
Figure 6C:
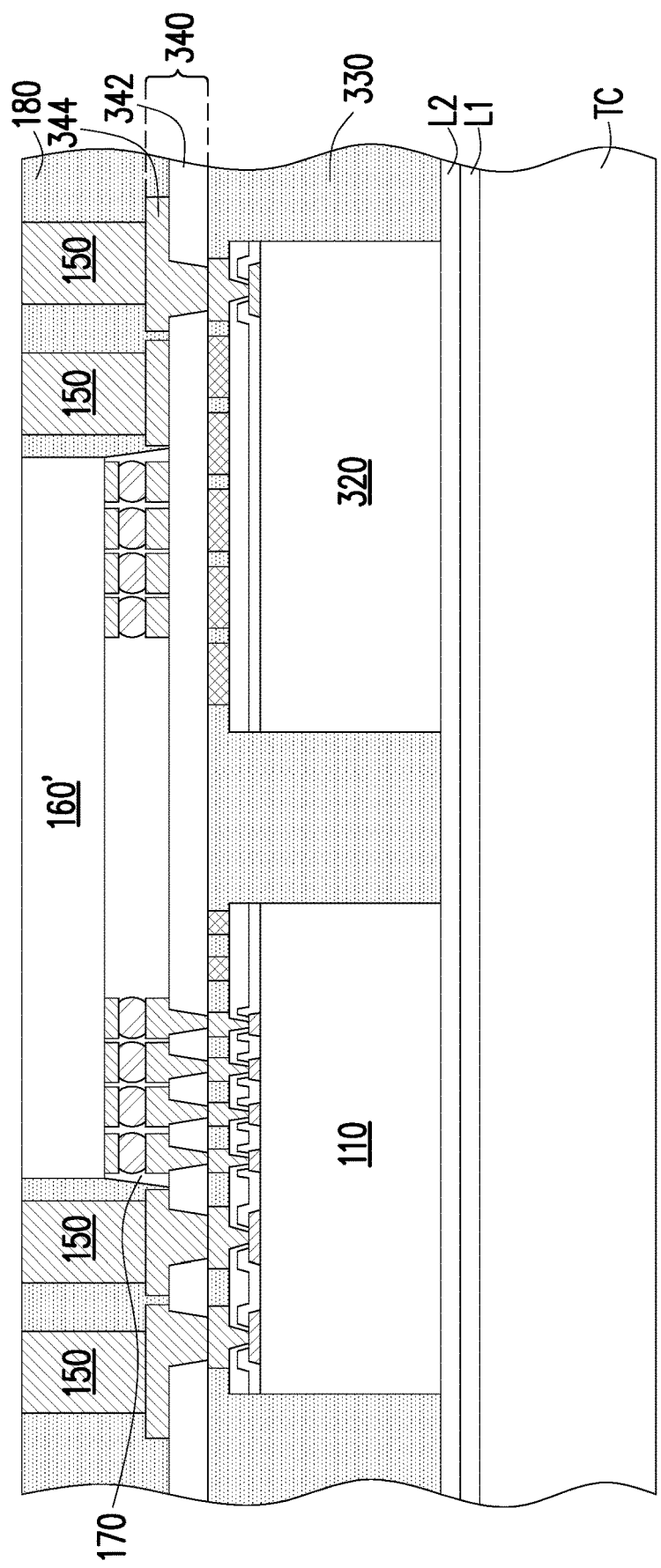
Figure 6D:
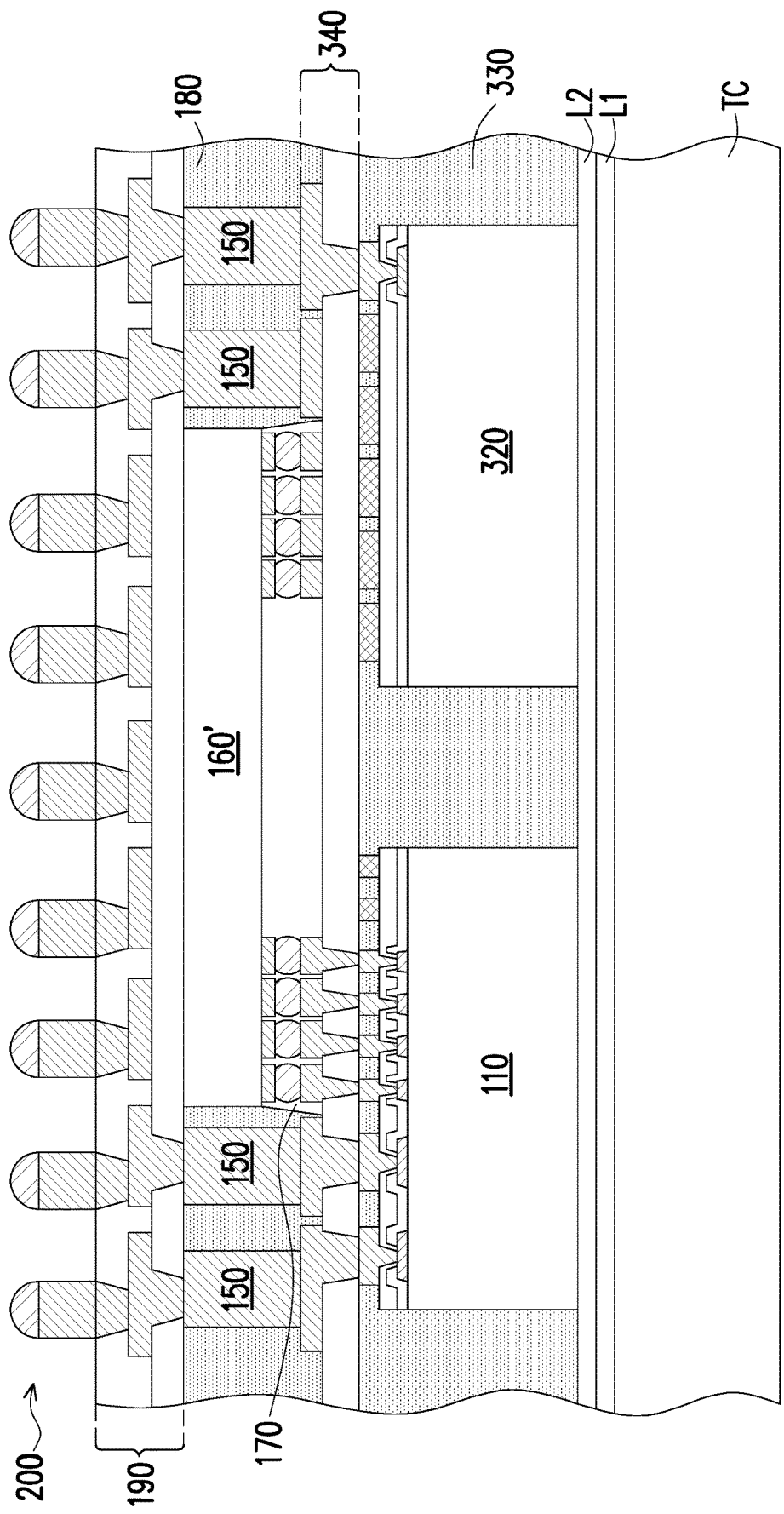
Figure 6E:
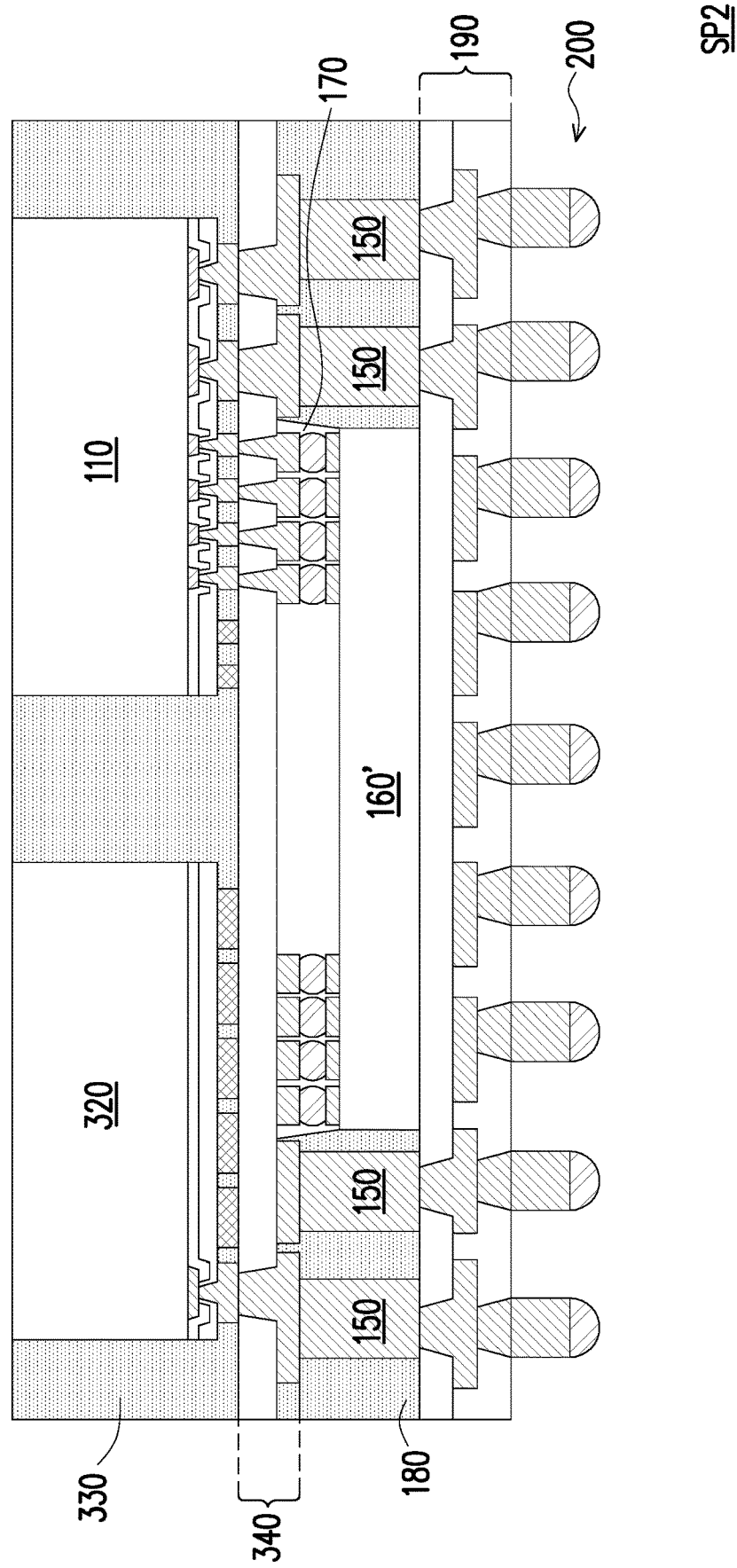
Figure 7:
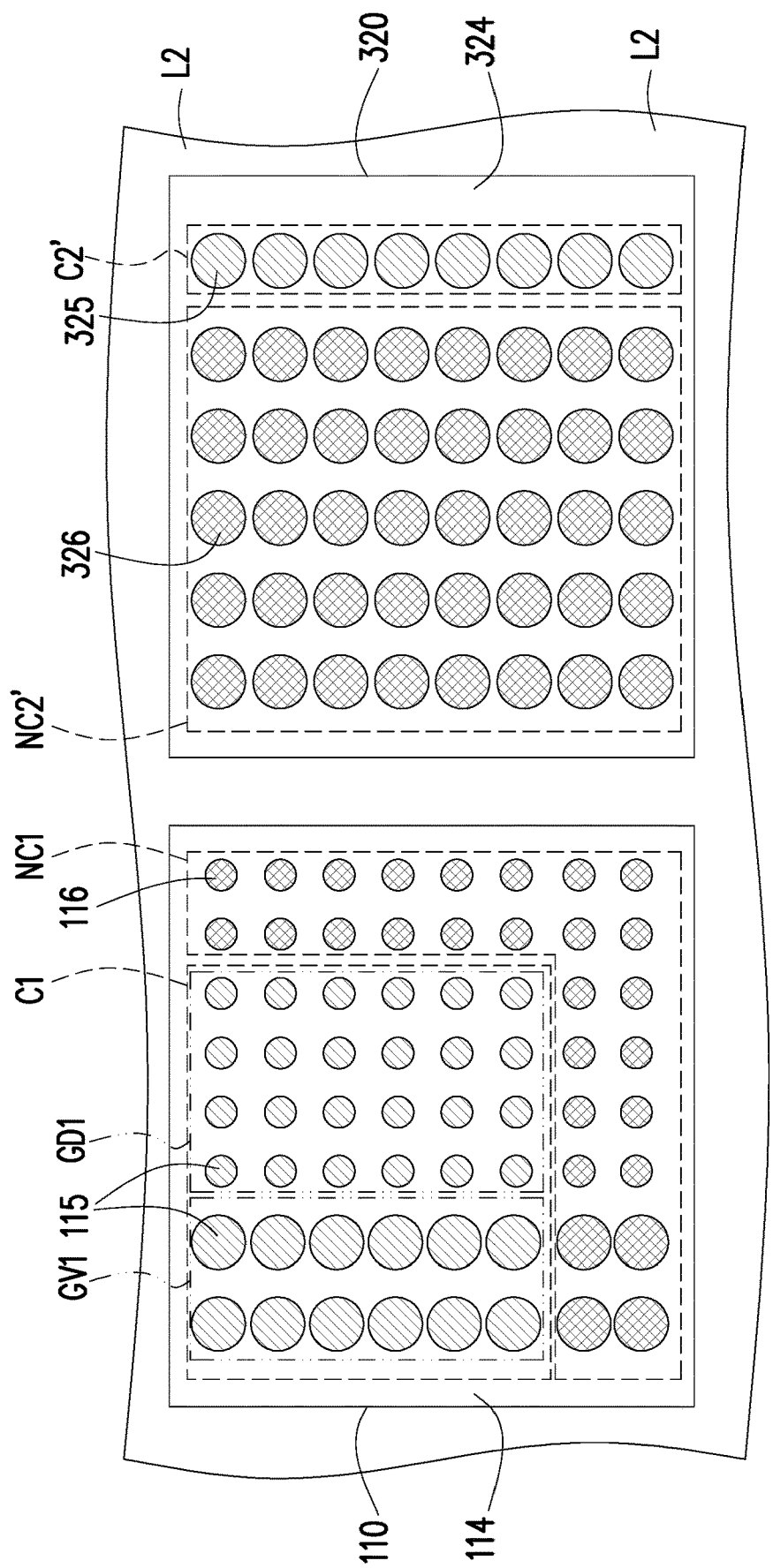
FIG. 7 is a schematic top view of FIG. 6A in accordance with some exemplary embodiments of the disclosure.

FIG. 6A to FIG. 6E are schematic cross-sectional views of various stages of manufacturing a semiconductor package in accordance with some exemplary embodiments of the disclosure, and FIG. 7 is a schematic top view of FIG. 6A in accordance with some exemplary embodiments of the disclosure. Throughout the various views and illustrative embodiments, the identical or similar numbers refer to the identical or similar elements. Referring to FIG. 6A and FIG. 7, different types of semiconductor dies are disposed on the temporary carrier TC. For example, the first semiconductor die 110 and a second semiconductor die 320 are picked and placed side by side on the temporary carrier TC. A gap is formed between the first semiconductor die 110 and the second semiconductor die 320 after disposing. The first semiconductor die 110 illustrated in FIG. 6A to FIG. 7 is the same as or similar to the first semiconductor die 110 as shown in FIG. 2A, and the detailed descriptions are omitted. In some embodiments, the second semiconductor die 320 (e.g., including a second semiconductor substrate 321, a second conductive pads 322, a second passivation layer 323, a second post-passivation layer 324, second electrical connectors 325, and second dummy conductors 326) is the same as or similar to the semiconductor die 20 singulated from the semiconductor wafer W2 as described in FIG. 5C. In some embodiments, the circuits in the first semiconductor die 110 and the second semiconductor die 320 are different from each other. In some embodiments, the second semiconductor die 320 is a memory die (e.g., SRAM die, DRAM die, MRAM die, or the like), and the first semiconductor die 110 is a logic die that includes logic circuits. Alternatively, the semiconductor dies disposed side by side are memory dies. It should be appreciated that the number and the types of semiconductor dies to be packaged may depend on the design requirements.

The second semiconductor die 320 may include a second contact region C2' and a second non-contact region NC2' in proximity to the second contact region C2'. The second electrical connectors 325 of the second semiconductor die 320 are disposed on the second contact region C2', and the second dummy conductors 326 of the second semiconductor die 320 are disposed on the second non-contact region NC2'. The second electrical connectors 325 are electrically connected to the IC component formed in the second semiconductor substrate 321 of the second semiconductor die 320. In some embodiments, the second contact region C2' of the second semiconductor die 320 is disposed at a periphery of the second semiconductor die 320, and a distribution area of the second non-contact region NC2' is greater than that of the second contact region C2'. For example, the second electrical connectors 325 on the second contact region C2' and the second dummy conductors 326 on the second non-contact region NC2' may be arranged in an array as shown in FIG. 7. The second electrical connectors 325 on the second contact region C2' may be distributed in a peripheral row or in a peripheral array extending parallel to the edge of the second semiconductor die 320, and the second dummy conductors 326 on the second non-contact region NC2' may be distributed throughout multiple rows and columns within the array. Alternatively, the second electrical connectors 325 on the second contact region C2' are arranged in an irregular pattern over the second semiconductor substrate 321, whilst the second dummy conductors 326 may be arranged around or between the second electrical connectors 325 to raise the density of conductive features over the second semiconductor substrate 321. More regular distribution of conductive features over the second semiconductor substrate 321 provided by the second dummy conductors 326 prevents the second semiconductor die 320 from tilting or dropping off. Since the second semiconductor die 320 includes not only the second electrical connector 325 on the second contact region C2', but also the second dummy conductors 326 on the second non-contact region NC2', are distributed over the second semiconductor substrate 321, when performing the pick-and-place process of the second semiconductor die 320, the second semiconductor die 320 is not tilted, but rather remains balanced. Thus, the configuration of the second electrical connectors 325 and the second dummy conductors 326 eliminates the die-tilting issue during the pick-and-place process, thereby improving die-disposing accuracy.

The first semiconductor die 110 including the first electrical connectors 115 on the first contact region C1 and the first dummy conductors 116 on the first non-contact region NC1 is disposed aside the second semiconductor die 320. The second non-contact region NC2' may be located between the first non-contact region NC1 and the second contact region C2'. In some embodiments, the distribution area of the second non-contact region NC2' of the second semiconductor die 320 is greater than that of the s first non-contact region NC1 of the first semiconductor die 110. It should be appreciated that other configurations of the first/second semiconductor dies are possible, which depends on the product requirements.

Referring to FIG. 6B, a first insulating encapsulation 330 is formed over the temporary carrier TC to laterally encapsulate the first semiconductor die 110 and the second semiconductor die 320. Subsequently, a first redistribution structure 340 is formed on the first insulating encapsulation 330, the first semiconductor die 110, and the second semiconductor die 320. The material and the forming processes of the first insulating encapsulation 330 may be similar to those of the first insulating encapsulation 130 as described in FIG. 2B, and the detailed descriptions are simplified for brevity. In some embodiments, the top surface 330a of the first insulating encapsulation 330 may be planarized and may be substantially flush with the active surface 110a of the first semiconductor die 110 and the top surface 320a of the second semiconductor die 320. Both of the second electrical connectors 325 and the second dummy conductors 326 may be accessibly distributed on the top surface 320a of the second semiconductor die 320. Alternatively, only second electrical connectors 325 are revealed by the first insulating encapsulation 330, whilst the second dummy conductors 326 are embedded in the first insulating encapsulation 330.

In some embodiments, after the first insulating encapsulation 330 is formed, the second electrical connector 325 and the second dummy conductors 326 are laterally wrapped by the first insulating encapsulation 330, but at least a portion of the second electrical connector 325 is accessibly revealed by the first insulating encapsulation 330 for further electrical connection. In certain embodiments in which a protection layer (not shown) encapsulates the second electrical connectors 325 and the second dummy conductors 326 for protection, at least the portion of the protection layer of the second semiconductor die 320 covering on the second electrical connectors 325 is removed so as to reveal the second electrical connectors 325. In such embodiments, the second electrical connectors 325 are laterally encapsulated by the protection layer, and the first insulating encapsulation 330 laterally encapsulates the protection layer of the second semiconductor die 320.

Continue to FIG. 6B, the first redistribution structure 340 may include a first patterned dielectric layer 342 and a first patterned conductive layer 344. The forming processes and the materials of the first redistribution structure 340 may be similar to those of the first redistribution structure 140 as described in FIG. 2C, and the detailed descriptions are simplified for brevity. The first patterned conductive layer 344 may penetrate through the first patterned dielectric layer 342 to be in physical and electrical contact with the first electrical connectors 115 of the first semiconductor die 110 and the second electrical connectors 325 of the second semiconductor die 320. The first electrical connectors 115 and/or the second electrical connectors 325 may provide power, ground, or signals depending on the types of the first and second semiconductor dies 110 and 320. The first patterned conductive layer 344 of the first redistribution structure 340 may provide signal connectivity between the first semiconductor die 110 and the second semiconductor die 320. In some embodiments, the first patterned conductive layer 344 reroutes electrical signals of the first semiconductor die 110 and the second semiconductor die 320 to provide access for connection with other electrical components. The first dummy conductors 116 and the second dummy conductors 326 may be remote from the first patterned conductive layer 344 and may be electrically insulated from all conductive features in the first redistribution structure 340. In some embodiments, the first dummy conductors 116 and the second dummy conductors 326 are electrically floating.

Referring to FIG. 6C, the conductive connectors 150 may be formed on the first redistribution structure 340. The third semiconductor die 160' is disposed on the first redistribution structure 340 and electrically coupled to the first semiconductor die 110 and the second semiconductor die 320. The underfill 170 is optionally formed between the third semiconductor die 160' and the first redistribution structure 340. The second insulating encapsulation 180 is formed on the first redistribution structure 340 to laterally encapsulate the conductive connectors 150, the third semiconductor die 160', and the underfill 170. The materials and the forming processes of the conductive connectors 150, the underfill 170, and the second insulating encapsulation 180, and the bonding process of the third semiconductor die 160' may be similar to the materials/processes described in FIG. 2D and FIG. 2E. The detailed descriptions are simplified for brevity.

In some embodiments, the third semiconductor die 160' is a silicon bridge which may be free from active components (e.g., transistors or the like) and/or passive components (e.g., resistors, capacitors, inductors, etc.). In other embodiments, the third semiconductor die 160' as the silicon bridge includes passive components, but no active component is built therein. The third semiconductor die 160' as the silicon bridge may include circuits for interconnection and die connectors for coupling one or more semiconductor dies to the silicon bridge. In some embodiments, the third semiconductor die 160' as the silicon bridge may not include through silicon vias built therein. Alternatively, the third semiconductor die 160' is similar to the third semiconductor die 160 including the TSVs and the device layer as shown in FIG. 2D. At least a portion of the conductive connectors 150 is accessibly revealed by the second insulating encapsulation 180, and the third semiconductor die 160' may be or may not be revealed by the second insulating encapsulation 180. It should be appreciated that examples are provided for illustrative purposes, and other embodiments may utilize fewer or additional elements. Any suitable numbers, combinations, and functionalities of semiconductor dies may alternatively be utilized.

Referring to FIG. 6D, the second redistribution structure 190 may be formed on the second insulating encapsulation 180, the third semiconductor die 160', and the conductive connectors 150. The conductive contacts 200 may be subsequently formed on the second redistribution structure 190. The forming processes of the second redistribution structure 190 and the conductive contacts 200 may be similar to the processes described in FIG. 2E and FIG. 2F, and the detailed descriptions are omitted for brevity.

Referring to FIG. 6E, a semiconductor package SP2 is formed. For example, after forming the conductive contacts 200, the following steps (e.g., removing temporary carrier TC along with the de-bonding layer L1, removing the adhesive layer L2, cleaning, singulating, etc.) as described in FIGS. 2G and 2H may be performed, so the detailed descriptions are no repeated herein. In some embodiment, the semiconductor package SP2 includes the second semiconductor die 320 performing different functions than the first semiconductor die 110 so that the semiconductor package SP2 may support different types of dies communication. For example, the first semiconductor die 110 functioning as a logic die and the second semiconductor die 320 functioning as a memory die may support logic to memory die communication. The semiconductor package SP2 may further mounted onto electrical/package components (e.g., the package component PC as described in FIG. 4) in demand.

According to some embodiments, a semiconductor package includes a first semiconductor die, an insulating encapsulation laterally encapsulating the first semiconductor die, and a redistribution structure disposed on the first semiconductor die and the insulating encapsulation. The first semiconductor die includes a first contact region and a first non-contact region in proximity to the first contact region.

The first semiconductor die includes a first electrical connector disposed on the first contact region and a first dummy conductor disposed on the first non-contact region, and the first electrical connector is electrically connected to a first integrated circuit (IC) component in the first semiconductor die. The first electrical connector is electrically connected to the redistribution structure, and the first dummy conductor is electrically insulated from the first IC component in the first semiconductor die and the redistribution structure.

According to some alternative embodiments, a semiconductor package includes a first semiconductor die and a second semiconductor die disposed side by side, a first insulating encapsulation laterally encapsulating the first semiconductor die and the second semiconductor die, and a redistribution structure disposed on the first insulating encapsulation, the first semiconductor die, and the second semiconductor die. Each of the first semiconductor die and the second semiconductor includes an array of electrical connectors and a dummy conductor disposed in proximity of the array of electrical connectors. The dummy conductors of the first semiconductor die and the second semiconductor die are disposed between the arrays of electrical connectors of the first semiconductor die and the second semiconductor die. The arrays of electrical connectors of the first semiconductor die and the second semiconductor die are in electrical contact with the redistribution structure, and the dummy conductors of the first semiconductor die and the second semiconductor die are electrically floating.

According to some alternative embodiments, a manufacturing method of a semiconductor package includes at least the following steps. A first semiconductor die and a second semiconductor die are laterally encapsulated with a first insulating encapsulation. Each of the first semiconductor die and the second semiconductor includes a contact region, a non-contact region in proximity to the contact region, an electrical connector is disposed on the contact region, and a dummy conductor is disposed on the non-contact region and electrically isolated. A redistribution structure is formed on the first insulating encapsulation, the first semiconductor die, and the second semiconductor die so as to be in electrical contact with the electrical connectors of the first semiconductor die and the second semiconductor die. The dummy conductors of the first semiconductor die and the second semiconductor die are electrically insulated from all conductive features in the redistribution structure. A package component is electrically coupled to the first semiconductor die and the second semiconductor die through the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a first semiconductor die, comprising a first contact region and a first non-contact region in proximity to the first contact region, the first semiconductor die comprising a plurality of first electrical connectors disposed on the first contact region and a plurality of first dummy conductors disposed on the first non-contact region, the first electrical connectors being electrically connected to a first integrated circuit (IC) component in the first semiconductor die, wherein:
    the first dummy conductors are arranged side by side to form an L-shaped array in a top view of the first semiconductor die, a row of the L-shaped array extends continuously from one end of a first edge of the first semiconductor die to the other end of the first edge, a column of the L-shape array extends continuously from the other end of the first edge to an end of a second edge of the first semiconductor die that is connected to the first edge, the L-shaped array is free of the first electrical connectors, and no conductive features are disposed between the first edge and the L-shaped array and between the second edge and the L-shaped array in the top view of the first semiconductor die,
    the first electrical connectors are arranged side by side to form a rectangular-shaped array in the top view, no conductive features are disposed between the first electrical connectors of the plurality of first electrical connectors in the top view of the first semiconductor die, a row of the first electrical connectors in the rectangular-shaped array and a row of the first dummy conductors at an end of the L-shaped array at the end of the second edge are arranged end to end and extend continuously from the end of the second edge of the first semiconductor die to an end of a third edge that is connected to the second edge, and no conductive features are disposed between the third edge and the row of the rectangular-shaped array and between the end of the L-shaped array and the third edge in the top view of the first semiconductor die;
    an insulating encapsulation, laterally encapsulating the first semiconductor die; and
    a redistribution structure, disposed on the first semiconductor die and the insulating encapsulation, wherein the first electrical connectors are electrically connected to the redistribution structure, and the first dummy conductors are electrically insulated from the first IC component in the first semiconductor die and is electrically insulated from the redistribution structure by a dielectric layer of the redistribution structure being in physical contact with top surfaces of the first dummy conductors.

2. The semiconductor package of claim 1, wherein
    at least two sides of the first contact region connected to one another are surrounded by the first non-contact region, and
    a distribution area of the first non-contact region of the first semiconductor die where the first dummy conductors are distributed over is smaller than that of the first contact region of the first semiconductor die where the first electrical connectors are distributed over.

3. The semiconductor package of claim 1, wherein the first dummy conductors disposed on the first non-contact region are electrically floating.

4. The semiconductor package of claim 1, wherein the first dummy conductors of the first semiconductor die are longitudinally insulated by the redistribution structure and a passivation layer of the first semiconductor die.

5. The semiconductor package of claim 1, wherein the first dummy conductors of the first semiconductor die are laterally insulated by the insulating encapsulation.

6. The semiconductor package of claim 1, further comprising:

a second semiconductor die, disposed aside the first semiconductor die, laterally encapsulated by the insulating encapsulation, and electrically connected to the redistribution structure, the second semiconductor die comprising a second contact region and a second non-contact region in proximity to the second contact region, wherein at least a part of the first non-contact region of the first semiconductor die and at least a part of the second non-contact region of the second semiconductor die are disposed between the first contact region of the first semiconductor die and the second contact region of the second semiconductor die.

7. The semiconductor package of claim 6, wherein the second semiconductor die further comprises:
a second electrical connector, disposed on the second contact region and being electrically connected to a second IC component in the second semiconductor die; and
a second dummy conductor, disposed on the second non-contact region and being electrically floating.

8. The semiconductor package of claim 6, wherein
the second contact region of the second semiconductor die is disposed at a periphery of the second semiconductor die, and
a distribution area of the second non-contact region of the second semiconductor die where a plurality of second dummy conductors are distributed over is greater than that of the second contact region of the second semiconductor die where a plurality of second electrical connectors are distributed over.

9. The semiconductor package of claim 1, wherein:
a shortest distance between a center of each one of the first electrical connectors in the row of the rectangular-shaped array and the third edge is substantially equal to a shortest distance between a center of each one of the first dummy conductors in the end of the L-shaped array.

10. A semiconductor package, comprising:
a first semiconductor die and a second semiconductor die, disposed side by side, each of the first semiconductor die and the second semiconductor comprising an array of electrical connectors and an array of dummy conductors disposed in proximity of the array of electrical connectors, wherein:
the electrical connectors of the first semiconductor die comprise a via-connecting group and a die-connecting group, diameters of the electrical connectors in the die-connecting group are substantially less than those of the electrical connectors in the via-connecting group, wherein an array of the die-connecting group comprises a first side, a second side connected to the first side, and a third side opposite to the first side, and the first side of the array of the die-connecting group is adjacent to a first side of an array of the via-connecting group;
the dummy conductors of the first semiconductor die comprise a first group and a second group, the first group is arranged in an array between a first die edge and a second side of the array of the via-connecting group that is connected to the first side of the array of the via-connecting group, the second group is arranged in a L-shaped array adjacent to the first group and the array of die-connecting group, a row of the L-shaped array extends continuously along the first die edge and the second side of the array of the die-connecting group, a column of the L-shaped array extends continuously along the third side of the array of the die-connecting group and a second die edge that is connected to the first die edge, and diameters of the dummy conductors in the second group are substantially less than those of the dummy conductors in the first group; and
a column of the array of the first group of the dummy conductors and a column of the array of the via-connecting group of the electrical connectors are arranged end to end and extend along a third die edge that is connected to the first die edge, no conductive features are disposed between the electrical connectors of the column of the array of the first group, no conductive features are disposed between the dummy conductors of the column of the array of the via-connecting group, and no conductive features are disposed between the third edge and the column of the array of the first group and between the third edge and the column of the array of the via-connecting group in a top view of the first semiconductor die;
a first insulating encapsulation, laterally encapsulating the first semiconductor die and the second semiconductor die; and
a redistribution structure, disposed on the first insulating encapsulation, the first semiconductor die, and the second semiconductor die, wherein the arrays of electrical connectors of the first semiconductor die and the second semiconductor die are in electrical contact with the redistribution structure, the dummy conductors of the first semiconductor die and the second semiconductor die are electrically floating, and the dummy conductors of the first semiconductor die and the second semiconductor die are electrically insulated from the redistribution structure by a dielectric layer of the redistribution structure being in physical contact with top surfaces of the dummy conductors.

11. The semiconductor package of claim 10, wherein the arrays of the electrical connectors and the dummy conductors of the first semiconductor die and the second semiconductor die are arranged in a mirror-symmetrical configuration.

12. The semiconductor package of claim 10, wherein a distribution area of the dummy conductors of the second semiconductor die is greater than that of the array of the electrical connectors of the second semiconductor die.

13. The semiconductor package of claim 10, wherein the L-shaped array of the second group of the dummy conductors is free of the electrical connectors.

14. The semiconductor package of claim 10, wherein a distribution density of the electrical connectors in the die-connecting group is denser than a distribution density of the electrical connectors in the via-connecting group.

15. The semiconductor package of claim 10, further comprising:
a through insulating via, disposed on the redistribution structure and electrically coupled to the first semiconductor die and the second semiconductor die through the redistribution structure; and
a second insulating encapsulation, disposed on the redistribution structure and encapsulating the through insulating via.

16. The semiconductor package of claim 15, further comprising:
a third semiconductor die, disposed on the redistribution structure, comprising a die connector facing toward the redistribution structure, and encapsulated by the second insulating encapsulation, wherein the first semiconductor die, the second semiconductor die, and the third semiconductor die are electrically coupled.

17. The semiconductor package of claim 10, wherein:
a shortest distance between a center of each one of the dummy conductors in the column of the array of the first group of and the third edge is substantially equal to a shortest distance between a center of each one of the electrical connectors in the column of the array of the via-connecting group.

18. The semiconductor package of claim 10, wherein:
the array of the dummy conductors of the second semiconductor die forms a column extending along a first die edge of the second semiconductor die, the column is free of the electrical connectors, and
the array of the electrical connectors of the second semiconductor die is free of the dummy conductors and are distributed in a rest area other than the column of the dummy conductors.

19. A manufacturing method of a semiconductor package, comprising:
laterally encapsulating a first semiconductor die and a second semiconductor die with a first insulating encapsulation, wherein:
the first semiconductor die comprising a first contact region and a first non-contact region in proximity to the first contact region, the first semiconductor die further comprising a plurality of first electrical connectors disposed on the first contact region and a plurality of first dummy conductors disposed on the first non-contact region, the first electrical connectors being electrically connected to a first integrated circuit (IC) component in the first semiconductor die, wherein:
the first dummy conductors are arranged side by side to form an L-shaped array in a top view of the first semiconductor die, a row of the L-shaped array extends continuously from one end of a first edge of the first semiconductor die to the other end of the first edge, a column of the L-shape array extends continuously from the other end of the first edge to an end of a second edge of the first semiconductor die that is connected to the first edge, the L-shaped array is free of the first electrical connectors, and no conductive features are disposed between the first edge and the L-shaped array and between the second edge and the L-shaped array in the top view of the first semiconductor die,
the first electrical connectors are arranged side by side to form a rectangular-shaped array in the top view, no conductive features are disposed between the first electrical connectors of the plurality of first electrical connectors in the top view of the first semiconductor die, a row of the first electrical connectors in the rectangular-shaped array and a row of the first dummy conductors at an end of the L-shaped array at the end of the second edge are arranged end to end and extend continuously from the end of the second edge of the first semiconductor die to an end of a third edge that is connected to the second edge, and no conductive features are disposed between the third edge and the row of the rectangular-shaped array and between the end of the L-shaped array and the third edge in the top view of the first semiconductor die;
forming a redistribution structure on the first insulating encapsulation, the first semiconductor die, and the second semiconductor die, wherein the first electrical connectors are electrically connected to the redistribution structure, and the first dummy conductors are electrically insulated from the first IC component in the first semiconductor die and is electrically insulated from the redistribution structure by a dielectric layer of the redistribution structure being in physical contact with top surfaces of the first dummy conductors,
electrically coupling a package component to the first semiconductor die and the second semiconductor die through the redistribution structure.

20. The manufacturing method according to claim 19, wherein after electrically coupling the package component to the first semiconductor die and the second semiconductor die, the first dummy conductors of the first semiconductor die and a plurality of second dummy conductors of the second semiconductor die are electrically floating.

21. The manufacturing method according to claim 19, wherein before laterally encapsulating the first semiconductor die and the second semiconductor die with the first insulating encapsulation, the first dummy conductors and the first electrical connectors are formed during the same process.

22. The manufacturing method according to claim 21, wherein when forming the first dummy conductors and the first electrical connectors of the first semiconductor die,
a portion of conductive materials formed on a plurality of connecting pads of the first semiconductor die functions as the first electrical connectors, and
another portion of the conductive materials formed on a passivation layer of the first semiconductor die functions as the first dummy conductors.

23. The manufacturing method according to claim 21, further comprising forming a plurality of second dummy conductors and a plurality of second electrical connectors of the second semiconductor die, wherein
a portion of conductive materials is formed on a plurality of connecting pads of the second semiconductor die and along a periphery of the second semiconductor die functions as the second electrical connectors, and
another portion of the conductive materials formed on a passivation layer of the second semiconductor die functions as the second dummy conductors, wherein the second dummy conductors cover a wider distribution area of the second semiconductor die than the second electrical connectors.

\* \* \* \* \*